(12) United States Patent
Takeuchi

(10) Patent No.: US 11,699,984 B2
(45) Date of Patent: *Jul. 11, 2023

(54) VIBRATOR DEVICE, VIBRATOR MODULE, AND ELECTRONIC APPARATUS

(71) Applicant: SEIKO EPSON CORPORATION, Tokyo (JP)

(72) Inventor: Junichi Takeuchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/804,031

(22) Filed: May 25, 2022

(65) Prior Publication Data

US 2022/0286104 A1 Sep. 8, 2022

Related U.S. Application Data

(63) Continuation of application No. 16/774,776, filed on Jan. 28, 2020, now Pat. No. 11,381,219.

(30) Foreign Application Priority Data

Jan. 31, 2019 (JP) .................................. 2019-016277

(51) Int. Cl.
*H03H 9/02* (2006.01)
*H03H 3/02* (2006.01)
(Continued)

(52) U.S. Cl.
CPC .......... *H03H 9/02133* (2013.01); *H03H 3/02* (2013.01); *H03H 9/0509* (2013.01);
(Continued)

(58) Field of Classification Search
CPC ........ H03H 9/02133; H03H 9/02; H03H 9/19; H03H 9/0509; H03H 9/10; H03H 9/04; H03H 2003/022
See application file for complete search history.

(56) References Cited

U.S. PATENT DOCUMENTS

| 6,229,249 | B1 * | 5/2001 | Hatanaka | H03H 9/1014 310/348 |
|---|---|---|---|---|
| 11,381,219 | B2 * | 7/2022 | Takeuchi | H03H 3/02 |
| 2016/0379908 | A1 * | 12/2016 | Ogasawara | H03H 9/17 310/344 |

FOREIGN PATENT DOCUMENTS

| JP | 2009-231774 | 10/2009 |
|---|---|---|
| JP | 2010-087929 | 4/2010 |
| JP | 2010-103479 | 5/2010 |

* cited by examiner

*Primary Examiner* — Jeffrey M Shin
(74) *Attorney, Agent, or Firm* — Workman Nydegger

(57) ABSTRACT

A vibrator device includes a base, a vibrator element attached to the base, and a lid housing the vibrator element between the base and itself and bonded to the base. The base has a semiconductor substrate including a first surface bonded to the lid and a second surface in a front-back relationship with the first surface, a first insulating layer placed on the first surface, first, second internal terminals placed on the first insulating layer and electrically coupled to the vibrator element, a second insulating layer placed on the second surface, and first, second external terminals placed on the second insulating layer and electrically coupled to the first, second internal terminals. The second insulating layer has a first external terminal region in which the first external terminal is placed and a second external terminal region separated from the first external terminal region, in which the second external terminal is placed.

7 Claims, 19 Drawing Sheets

(51) Int. Cl.
*H03H 9/10* (2006.01)
*H03H 9/19* (2006.01)
*H03H 9/05* (2006.01)

(52) U.S. Cl.
CPC ............ *H03H 9/1021* (2013.01); *H03H 9/19* (2013.01); *H03H 2003/022* (2013.01)

VIBRATOR DEVICE, VIBRATOR MODULE, AND ELECTRONIC APPARATUS

This application is a continuation of U.S. patent Ser. No. 16/774,776, filed Jan. 28, 2020, which is based on, and claims priority to, JP Application Serial Number 2019-016277, filed Jan. 31, 2019, the disclosures of which are hereby incorporated by reference herein in their entirety.

BACKGROUND

1. Technical Field

The present disclosure relates to a vibrator device, a vibrator module, and an electronic apparatus, and a method of manufacturing the vibrator device.

2. Related Art

A piezoelectric device described in JP-A-2010-87929 includes a first substrate having a concave portion opening in an upper surface, a piezoelectric vibrator element attached to a bottom surface of the concave portion, and a second substrate bonded to the upper surface of the first substrate to close the opening of the concave portion. Further, the piezoelectric device includes a first insulating layer formed on an inner surface of the concave portion of the first substrate and a third insulating layer formed on a lower surface of the first substrate. In the configuration, to suppress deformation of the first substrate, the first substrate is sandwiched by the first insulating layer and the third insulating layer.

However, when the insulating layers are formed on the inner surface and the lower surface of the concave portion to reduce the deformation of the first substrate, stress remaining in the first substrate may increase. Specifically, warpage produced in the first substrate by one insulating layer of the insulating layer on the inner surface of the concave portion and the insulating layer on the lower surface of the concave portion is cancelled out by the other insulating layer, and therefore, the stress remaining in the first substrate may increase.

SUMMARY

A vibrator device according to an application example includes a base, a vibrator element attached to the base, and a lid bonded to the base to house the vibrator element between the base and itself. The base has a semiconductor substrate including a first surface to which the lid is bonded and a second surface in a front-back relationship with the first surface, a first insulating layer placed on the first surface, a first internal terminal and a second internal terminal placed on the first insulating layer and electrically coupled to the vibrator element, a second insulating layer placed on the second surface, and a first external terminal electrically coupled to the first internal terminal and a second external terminal electrically coupled to the second internal terminal, which are placed on the second insulating layer. The second insulating layer has a first external terminal region in which the first external terminal is placed and a second external terminal region separated from the first external terminal region, in which the second external terminal is placed.

A vibrator device according to an application example includes a base, a vibrator element attached to the base, and a lid bonded to the base to house the vibrator element between the base and itself. The base has a semiconductor substrate including a first surface to which the lid is bonded and a second surface in a front-back relationship with the first surface, a first insulating layer placed on the first surface, a first internal terminal and a second internal terminal placed on the first insulating layer and electrically coupled to the vibrator element, a second insulating layer placed on the second surface, and a first external terminal electrically coupled to the first internal terminal and a second external terminal electrically coupled to the second internal terminal, which are placed on the second insulating layer. The first insulating layer has a first internal terminal region in which the first internal terminal is placed and a second internal terminal region separated from the first internal terminal region, in which the second internal terminal is placed.

A vibrator module according to an application example includes the above described vibrator device.

An electronic apparatus according to an application example includes the above described vibrator device.

A method of manufacturing a vibrator device according to an application example includes preparing a base substrate having a first surface and a second surface in a front-back relationship with each other, forming a first insulating layer on the first surface, and forming a second insulating layer on the second surface, forming a first internal terminal and a second internal terminal on the first insulating layer and forming a first external terminal and a second external terminal on the second insulating layer, performing at least one of separating the first insulating layer into a first internal terminal region in which the first internal terminal is placed and a second internal terminal region in which the second internal terminal is placed and separating the second insulating layer into a first external terminal region in which the first external terminal is placed and a second external terminal region in which the second external terminal is placed, attaching the vibrator element at the first surface side of the base substrate and electrically coupling the vibrator element and the first internal terminal and the second internal terminal, and bonding the lid to the first surface of the base substrate and housing the vibrator element between the base substrate and the lid.

DESCRIPTION OF EXEMPLARY EMBODIMENTS

As below, a vibrator device, a vibrator module, an electronic apparatus, and a method of manufacturing the vibrator device will be explained in detail based on embodiments shown in the accompanying drawings.

First Embodiment

Figure 1:
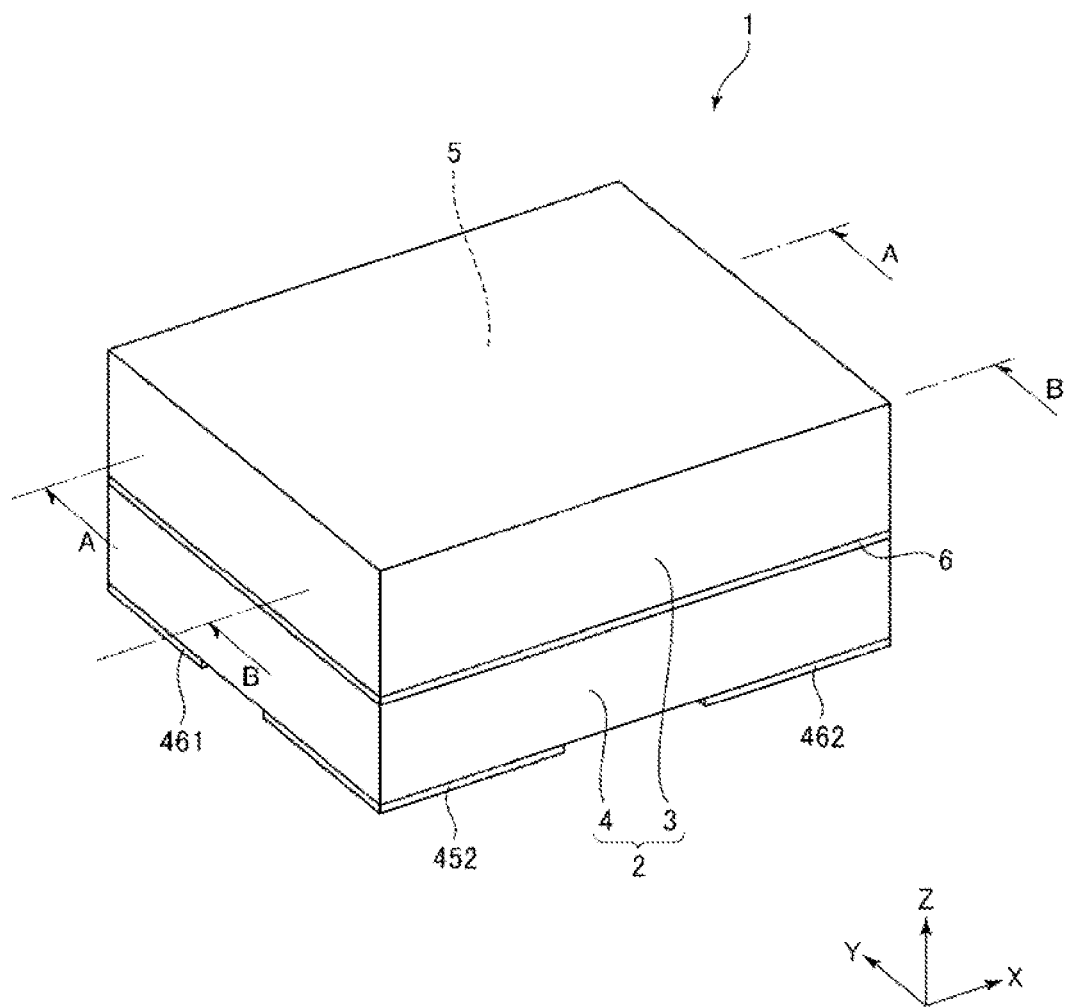
FIG. 1 is a perspective view showing a vibrator device according to a first embodiment.
Figure 2:
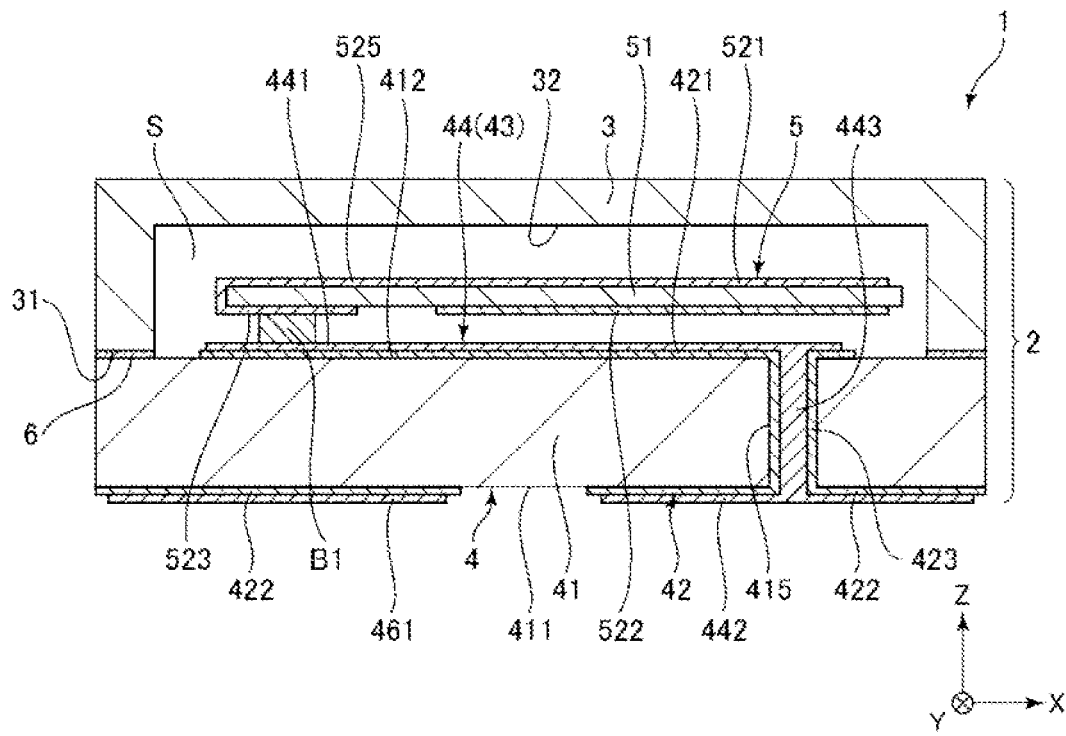
FIG. 2 is a sectional view along line A-A in FIG. 1.
Figure 3:
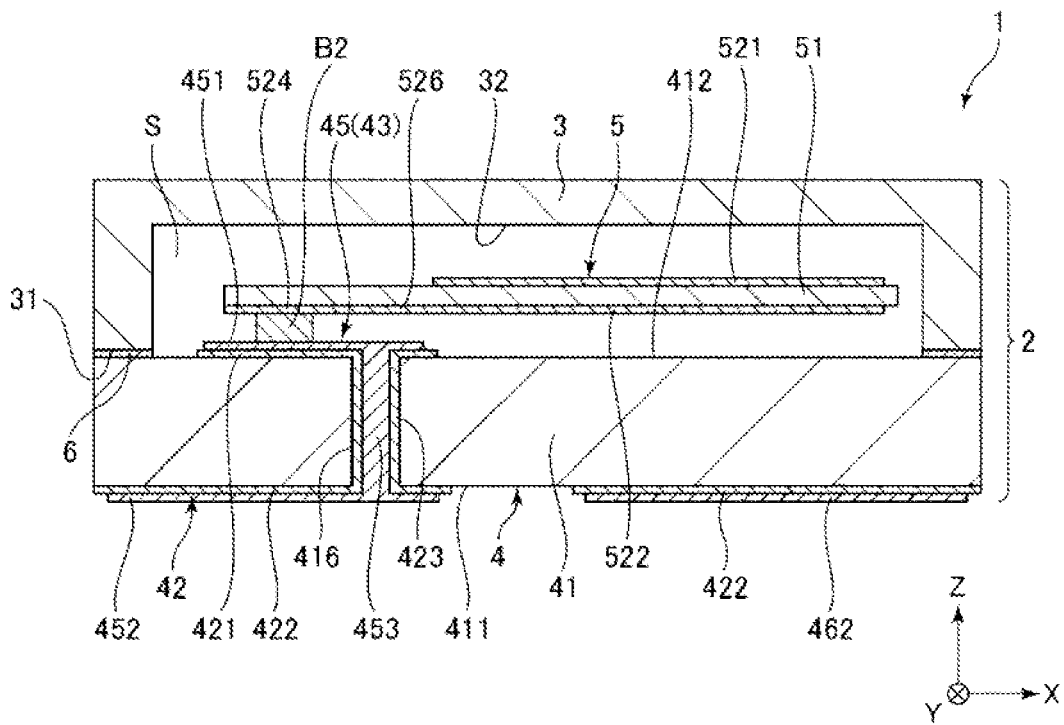
FIG. 3 is a sectional view along line B-B in FIG. 1.
Figure 4:
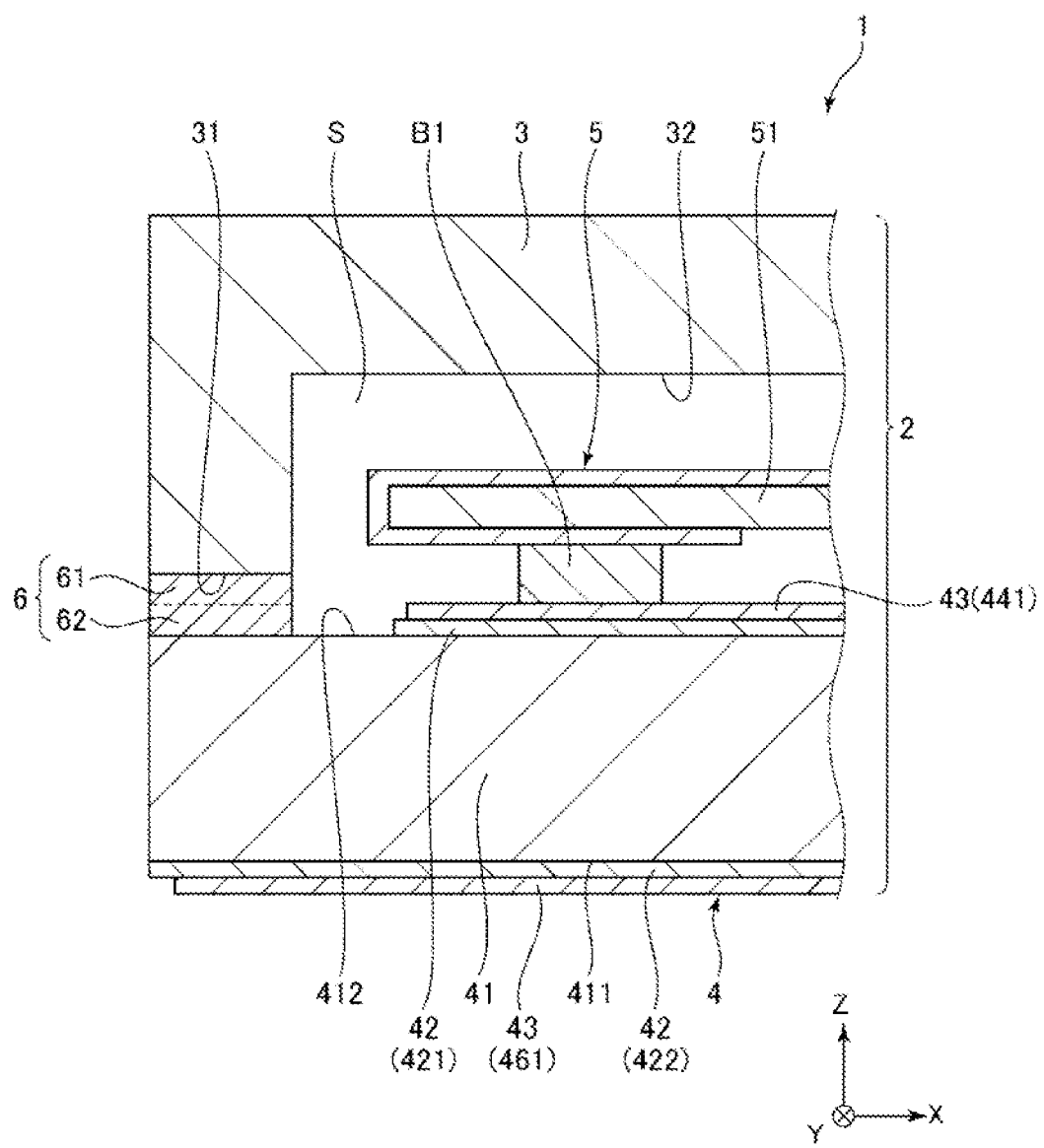
FIG. 4 is a sectional view showing a bonding part between a base substrate and a lid.
Figure 5:
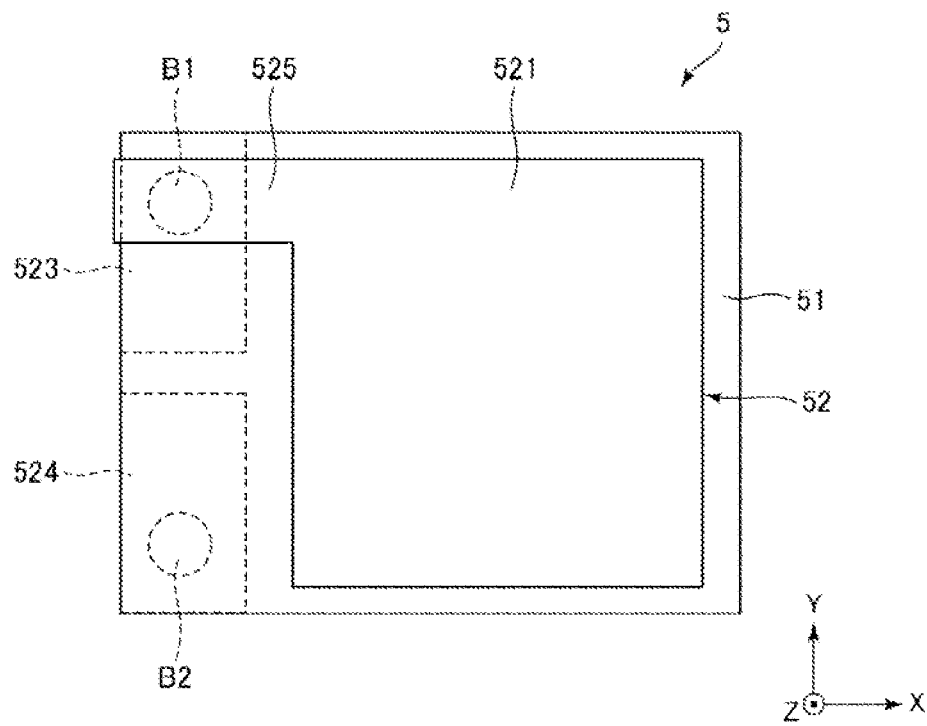
FIG. 5 is a plan view of a vibrator element.
Figure 6:
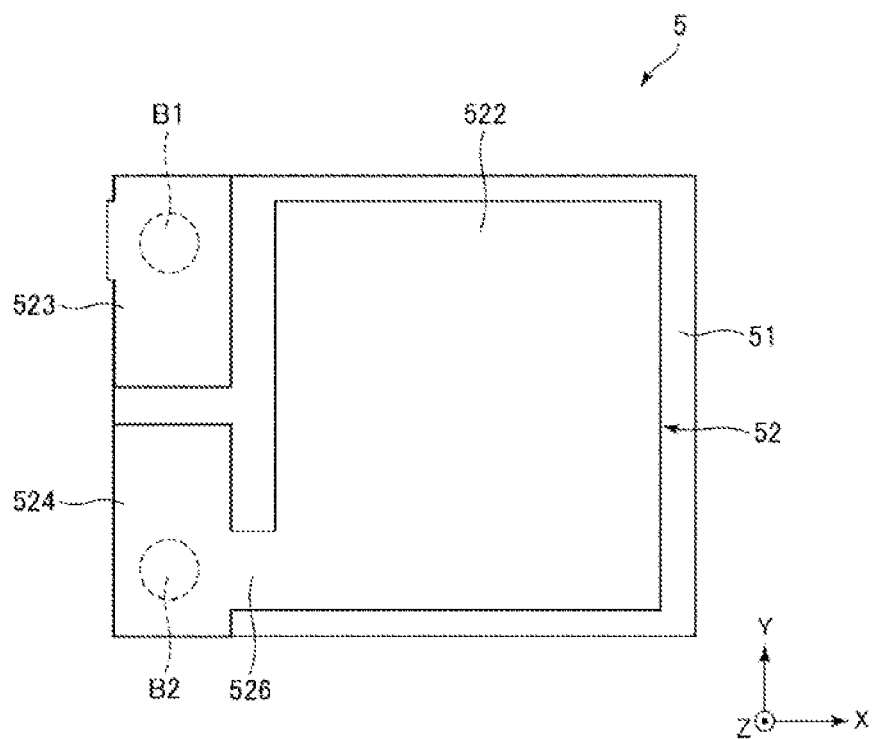
FIG. 6 is a transmissive view of the vibrator element as seen from upside.
Figure 7:
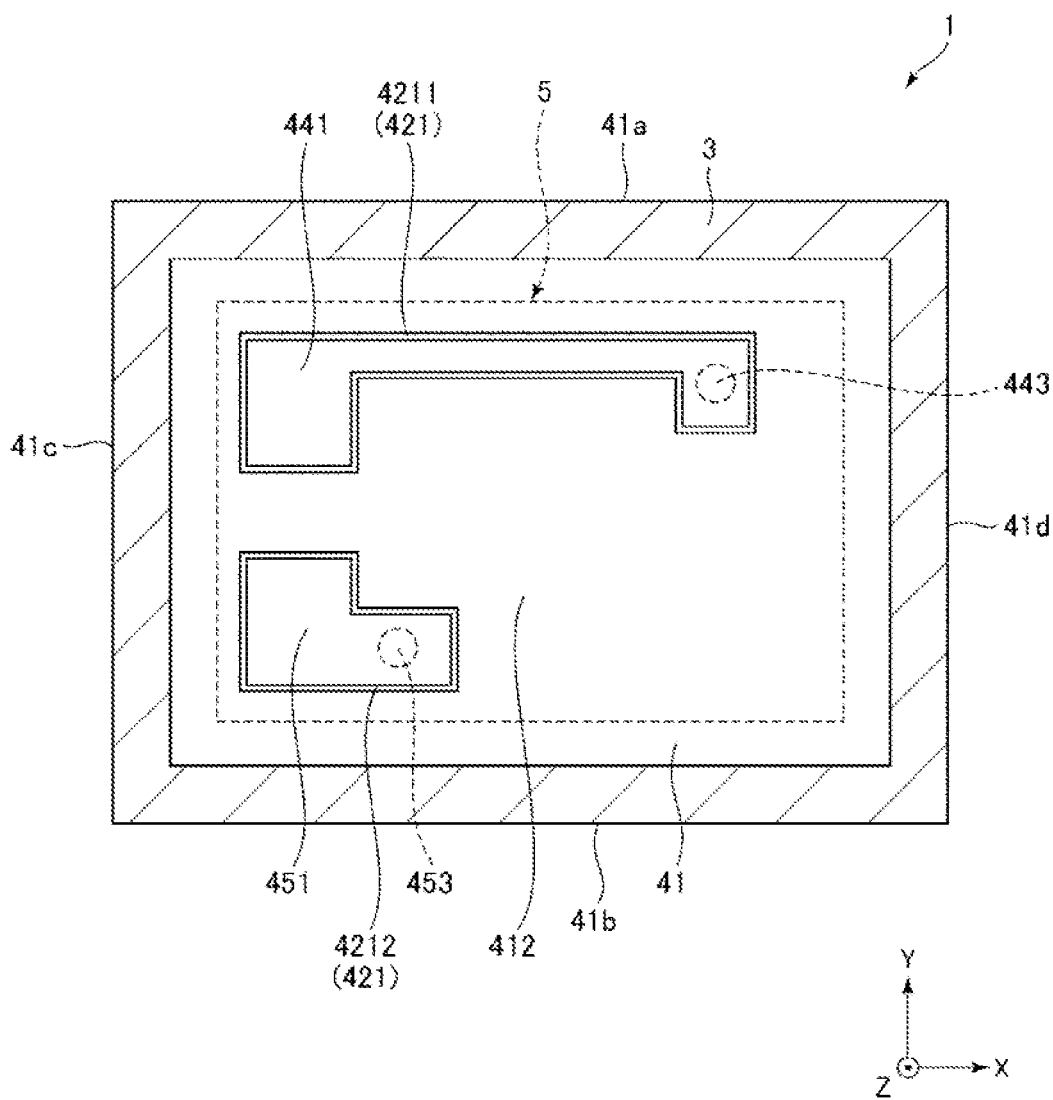
FIG. 7 is a plan view showing an upper surface insulating layer placed on an upper surface of the base substrate.
Figure 8:
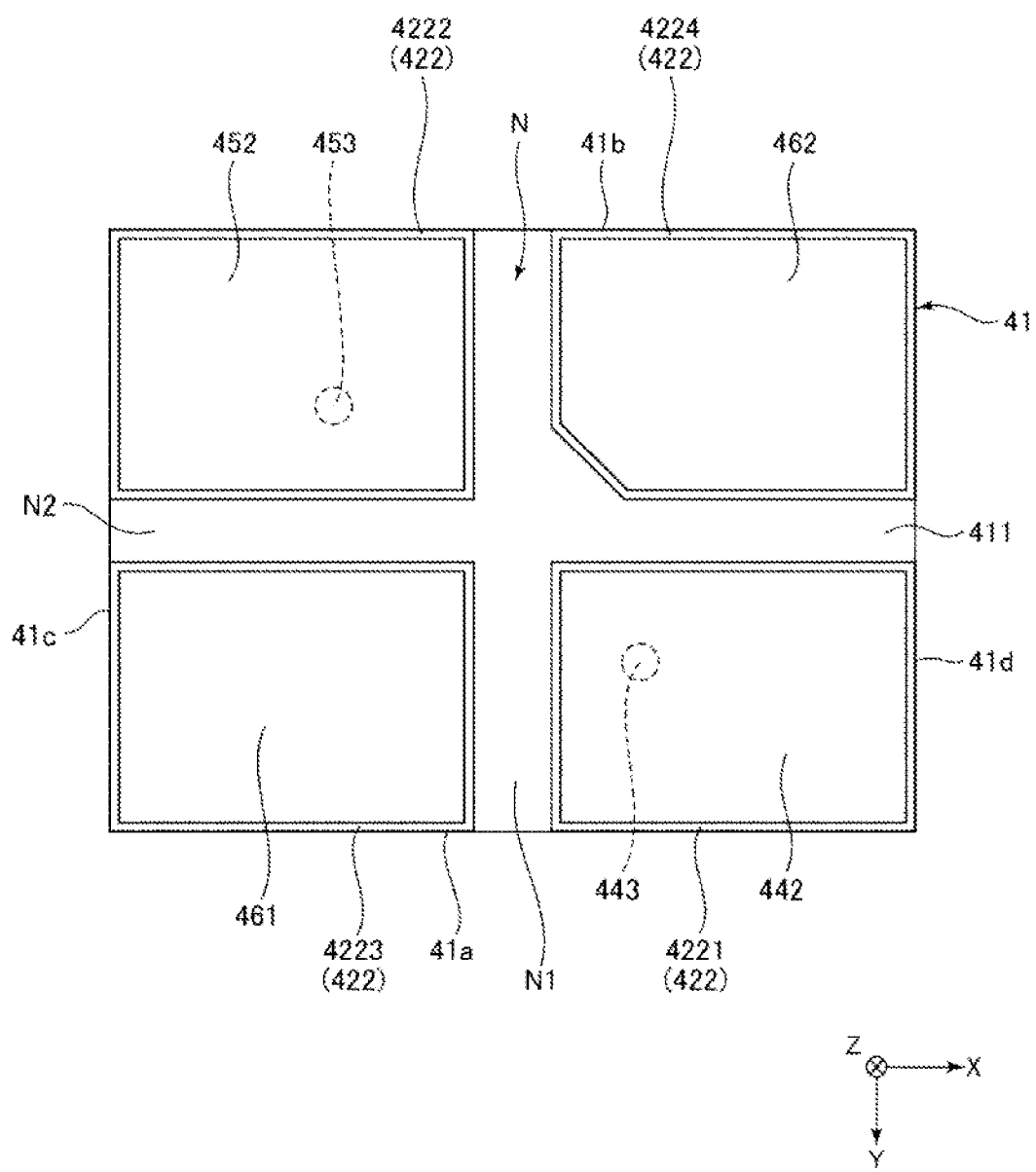
FIG. 8 is a plan view showing a lower surface insulating layer placed on a lower surface of the base substrate.
Figure 9:
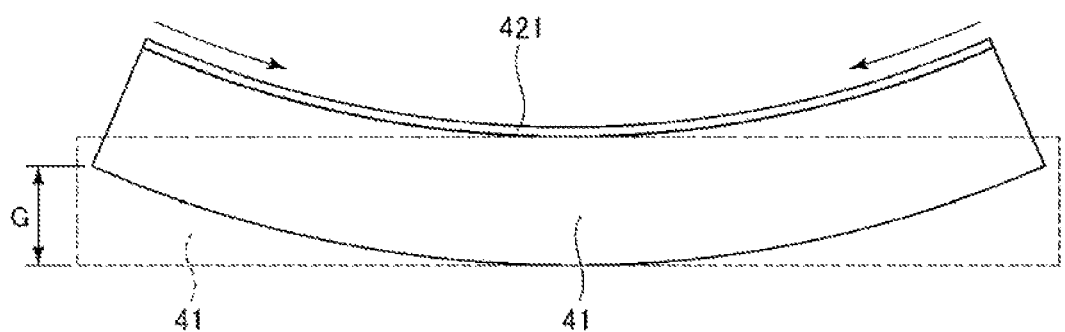
FIG. 9 is a schematic diagram for explanation of a problem of a comparative example.
Figure 10:
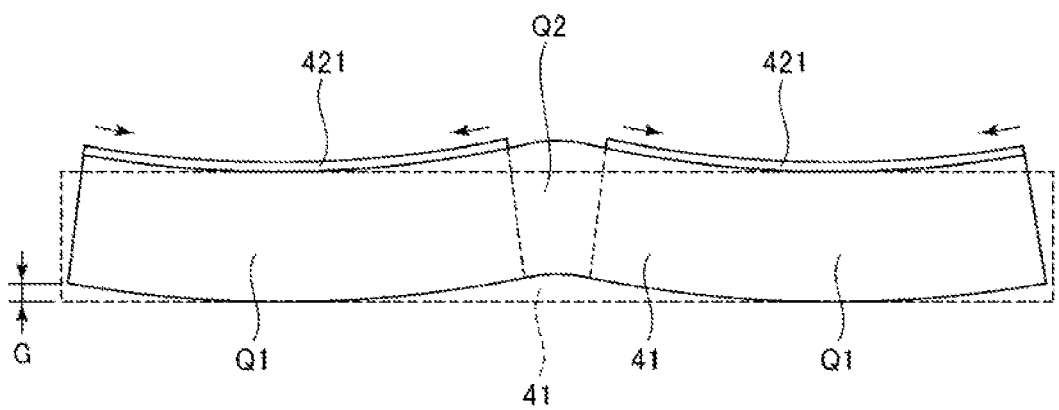
FIG. 10 is a schematic diagram for explanation of an effect.
Figure 11:
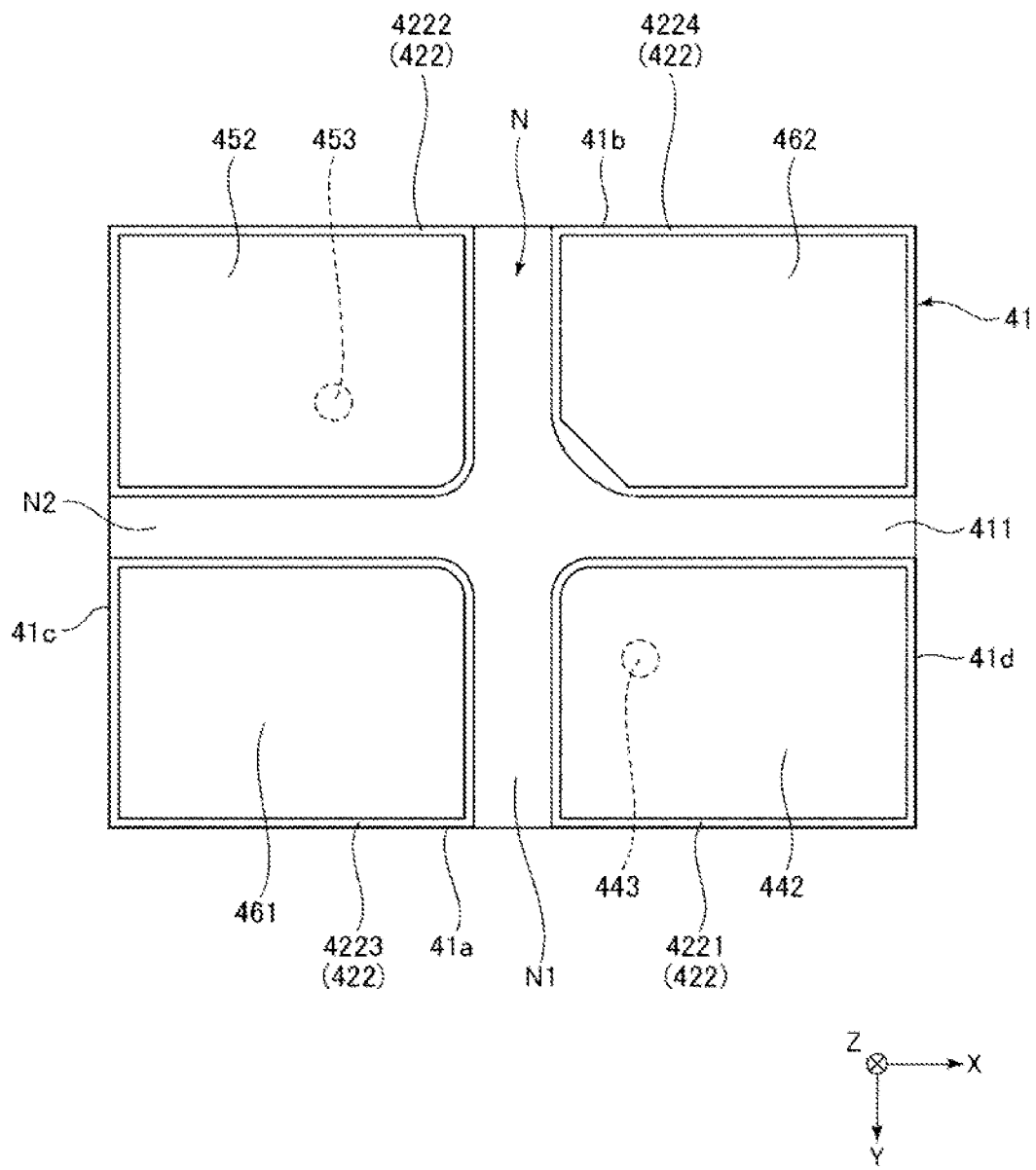
FIG. 11 is a plan view showing a modified example of the lower surface insulating layer.
Figure 12:
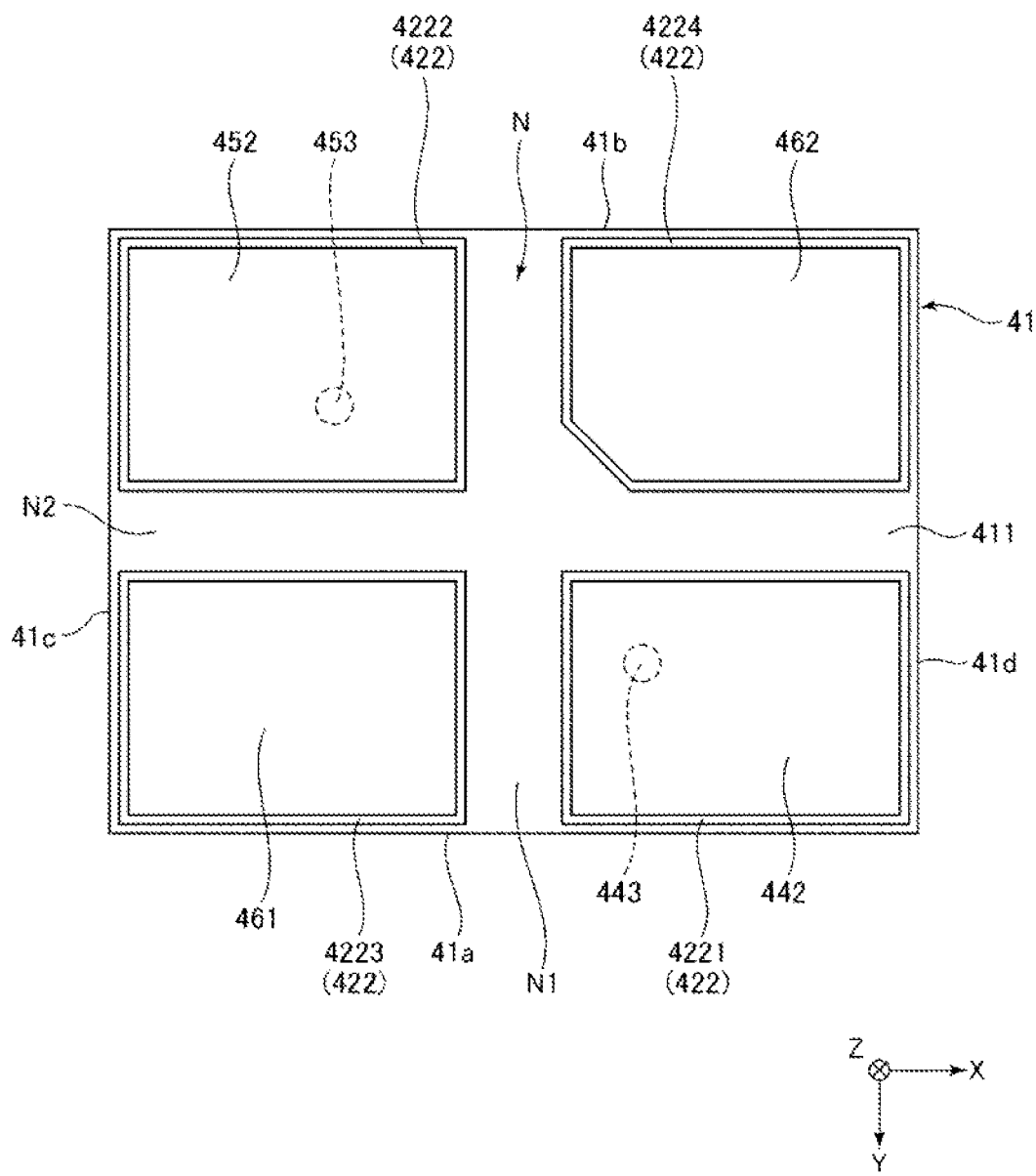
FIG. 12 is a plan view showing a modified example of the lower surface insulating layer.
Figure 13:
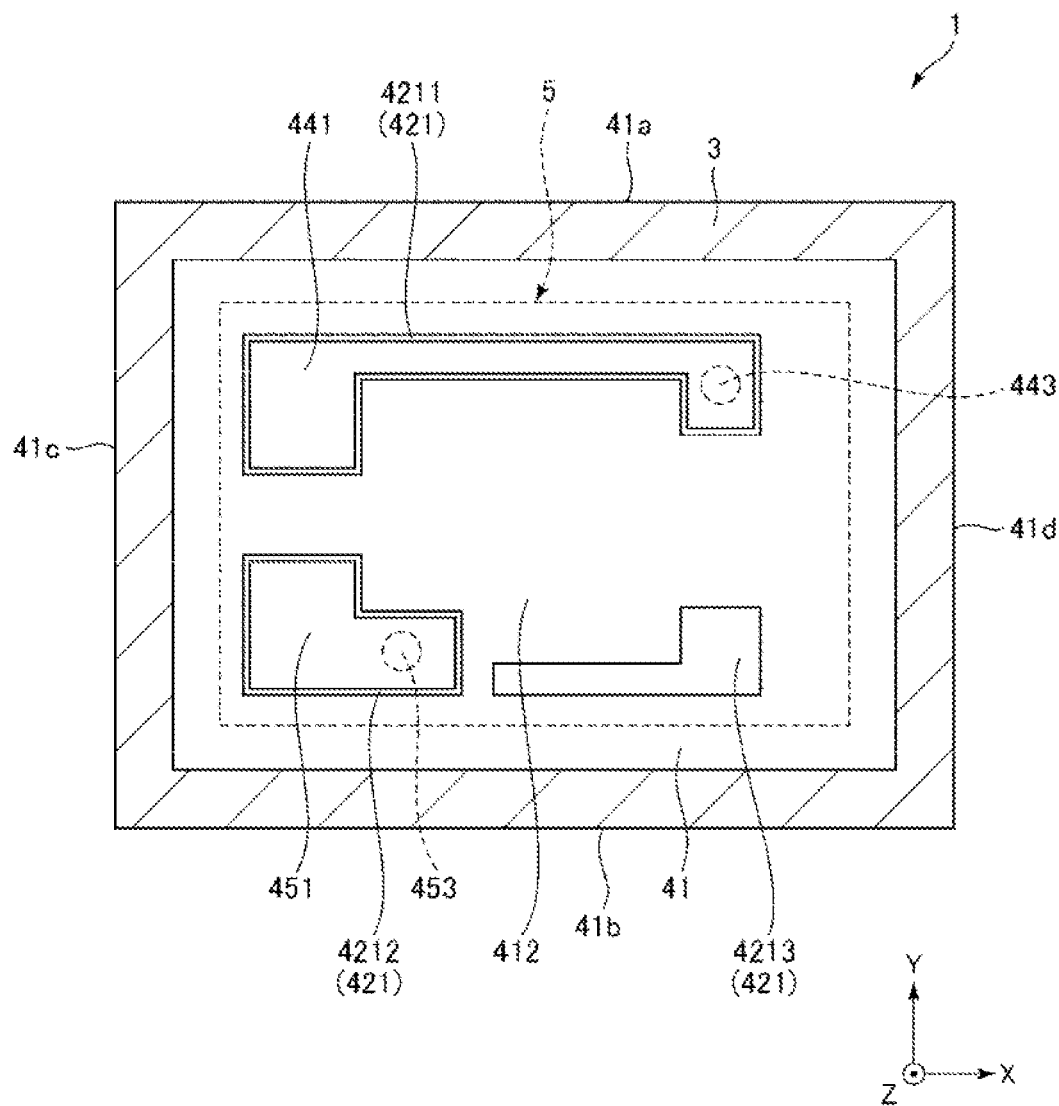
FIG. 13 is a plan view showing a modified example of the upper surface insulating layer.
Figure 14:
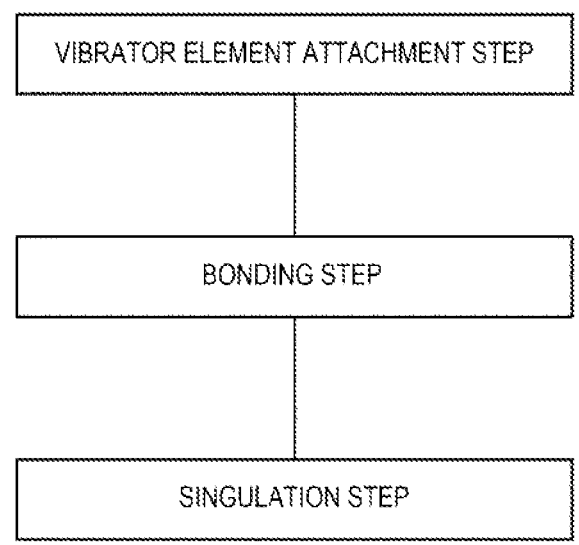
FIG. 14 shows a manufacturing process of the vibrator device.

FIG. 1 is the perspective view showing the vibrator device according to the first embodiment. FIG. 2 is the sectional view along line A-A in FIG. 1. FIG. 3 is the sectional view along line B-B in FIG. 1. FIG. 4 is the sectional view showing the bonding part between the base substrate and the lid. FIG. 5 is the plan view of the vibrator element. FIG. 6 is the transmissive view of the vibrator element as seen from upside. FIG. 7 is the plan view showing the upper surface insulating layer placed on the upper surface of the base substrate. FIG. 8 is the plan view showing the lower surface insulating layer placed on the lower surface of the base substrate. FIG. 9 is the schematic diagram for explanation of the problem of the comparative example. FIG. 10 is the schematic diagram for explanation of the effect of an application example. FIGS. 11 and 12 are plan views respectively showing the modified examples of the lower surface insulating layer. FIG. 13 is the plan view showing the modified example of the upper surface insulating layer. FIG. 14 shows the manufacturing process of the vibrator device. FIGS. 15 to 21 are sectional views respectively showing the manufacturing process of the vibrator device.

For convenience of explanation, three axes orthogonal to one another are shown as an X-axis, a Y-axis, and a Z-axis in the respective drawings. Further, the tip end side of the arrow of the Z-axis is also referred to as "upper" and the base end side is also referred to as "lower". Further, a plan view along the thickness direction of the base substrate, i.e., along the Z-axis is also simply referred to as "plan view".

As shown in FIG. 1, the vibrator device 1 has a vibrator element 5 and a package 2 housing the vibrator element 5. Further, as shown in FIGS. 2 and 3, the package 2 has a box-shaped lid 3 having a concave portion 32 housing the vibrator element 5, and a plate-like base 4 bonded to the lid 3 to close an opening of the concave portion 32. The opening of the concave portion 32 is closed by the base 4, and thereby, a housing space S for housing the vibrator element 5 is formed. The housing space S is air-tightly sealed in a reduced pressure condition, preferably closer to a vacuum condition. Note that the atmosphere of the housing space S is not particularly limited, but may be e.g. an atmosphere of an inert gas of nitrogen, Ar, or the like enclosed in an atmospheric condition or pressurized condition, not the reduced-pressure condition.

The base 4 has a plate-like base substrate 41, an insulating layer 42 placed on a surface of the base substrate 41, and an electrode 43 placed on the insulating layer 42.

The base substrate 41 has a rectangular plate shape in the plan view and has a lower surface 411 and an upper surface 412 in a front-back relationship with each other. Further, the base substrate 41 has two through holes 415, 416 penetrating the upper surface 412 and the lower surface 411. Note that, hereinafter, four sides contained in the outer edge of the base substrate 41 are also referred to as "first side 41a", "second side 41b", "third side 41c", and "fourth side 41d", and the first side 41a and the second side 41b face each other and the third side 41c and the fourth side 41d face each other.

The base substrate 41 is a semiconductor substrate. The semiconductor substrate is not particularly limited, but e.g. a silicon substrate, germanium substrate, or a compound semiconductor substrate of GaP, GaAs, InP, or the like may be used. The semiconductor substrate is used as the base substrate 41, thereby, the vibrator device 1 may be formed by a semiconductor process, and thus, the vibrator device 1 may be accurately manufactured and downsized. Further, for example, a semiconductor circuit such as an oscillation circuit may be formed on the base 4 and the base 4 may be effectively utilized. Note that, when the semiconductor circuit is formed on the base 4, the upper surface 412 side may be used as an active face or the lower surface 411 side may be used as an active face. Particularly, in the embodiment, a silicon substrate is used as the base substrate 41. Thereby, the base substrate 41 is easily available and inexpensive.

Further, the insulating layer 42 is placed on the surfaces of the base substrate 41. The insulating layer 42 has an upper surface insulating layer 421 placed on the upper surface 412 of the base substrate 41, a lower surface insulating layer 422 placed on the lower surface 411, and through hole insulating layers 423 placed within the through holes 415, 416. Of the layers, the upper surface insulating layer 421 is placed in the center part of the upper surface 412 except the outer edge portion, i.e., the bonding part to the lid 3. That is, the outer edge portion of the upper surface 412 is exposed from the upper surface insulating layer 421.

Note that another layer intervenes between the upper surface 412 and the upper surface insulating layer 421 as long as the upper surface insulating layer 421 is placed on the upper surface 412, and another layer intervenes between the lower surface 411 and the lower surface insulating layer 422 as long as the lower surface insulating layer 422 is placed on the lower surface 411.

The insulating layer 42 is formed of a silicon oxide film (SiO$_2$ film). Further, the method of forming the insulating layer 42 is not particularly limited, but, for example, the layer may be formed by thermal oxidation of the surfaces of the base substrate 41 or plasma CVD using TEOS (tetraethoxysilane). Note that the insulating layer 42 is not particularly limited, but, for example, the layer may be formed of an insulating resin material such as polyimide or a complex in which different materials are stacked.

The electrode 43 is placed on the insulating layer 42. The electrode 43 has a first wire 44 and a second wire 45 placed apart from each other. The first wire 44 has an internal terminal 441 placed on the upper surface insulating layer 421 and facing inside of the housing space S, an external terminal 442 placed on the lower surface insulating layer 422 and facing outside of the package 2, and a through electrode 443 placed within the through hole 415 and electrically coupling the internal terminal 441 and the external terminal 442. Similarly, the second wire 45 has an internal terminal 451 placed on the upper surface insulating layer 421 and facing inside of the housing space S, an external terminal 452 placed on the lower surface insulating layer 422 and facing outside of the package 2, and a through electrode 453 placed within the through hole 416 and electrically coupling the internal terminal 451 and the external terminal 452.

Further, the electrode 43 has two dummy terminals 461, 462 placed on the lower surface insulating layer 422. The dummy terminals 461, 462 do not fulfill electrical roles, but, for example, are provided for increasing the bonding strength between the package 2 and an object. Note that the role of the dummy terminals 461, 462 is not limited to that.

The lid 3 is in the box shape having the concave portion 32 with a bottom opening in a lower surface 31 thereof. The lid 3 is a semiconductor substrate. The semiconductor substrate is not particularly limited, but e.g. a silicon substrate, germanium substrate, or a compound semiconductor substrate of GaP, GaAs, InP, or the like may be used. The semiconductor substrate is used as the lid 3, thereby, the vibrator device 1 may be formed by a semiconductor process, and thus, the vibrator device 1 may be accurately manufactured and downsized. Particularly, in the embodiment, a silicon substrate is used as the lid 3. Thereby, the lid 3 is easily available and inexpensive. Further, the same material may be used for the base substrate 41 and the lid 3, and a difference in thermal expansion coefficient therebetween may be substantially zero. Accordingly, thermal stress due to thermal expansion is suppressed, and the vibrator device 1 having excellent vibration characteristics is obtained.

Note that the lid 3 is not limited to the semiconductor substrate, but e.g. a ceramic substrate, glass substrate, or the like may be used. Or, as the lid 3, a different type of substrate from the base substrate 41 may be used. Particularly, when a glass substrate having light transmissivity is used as the lid 3, after the vibrator device 1 is manufactured, the vibrator element 5 may be irradiated with laser via the lid 3 and a part of an excitation electrode 521 may be removed, and thereby, frequency adjustment of the vibrator element 5 may be performed.

The lid 3 is directly bonded to the upper surface 412 of the base substrate 41 via a bonding member 6 on the lower surface 31 thereof. In the embodiment, the lid 3 and the base substrate 41 are bonded by diffusion bonding using diffusion of metals of direct bonding. Specifically, as shown in FIG. 4, a metal film 61 is provided on the lower surface 31 of the lid 3 and a metal film 62 is provided on the upper surface 412 of the base substrate 41, the bonding member 6 is formed by diffusion bonding of a lower surface of the metal film 61 and an upper surface of the metal film 62, and the lid 3 and the base substrate 41 are bonded via the bonding member 6. Note that the bonding method is not limited to that, but, for example, the lower surface 31 of the lid 3 and the upper surface 412 of the base substrate 41 may be irradiated with an inert gas such as an argon gas for activation of these surfaces and the lower surface 31 and the upper surface 412 may be directly bonded.

As shown in FIGS. 5 and 6, the vibrator element 5 has a vibrator substrate 51 and an electrode 52 placed on a surface of the vibrator substrate 51. The vibrator substrate 51 has a thickness-shear vibration mode and, in the embodiment, is formed of an AT cut quartz crystal substrate. The AT cut quartz crystal substrate has third-order frequency-temperature characteristics, and the vibrator element 5 having excellent temperature characteristics is obtained.

The electrode 52 has the excitation electrode 521 placed on the upper surface of the vibrator substrate 51, and an excitation electrode 522 placed on the lower surface to face the excitation electrode 521 via the vibrator substrate 51. Further, the electrode 52 has a pair of terminals 523, 524 placed on the lower surface of the vibrator substrate 51, a wire 525 electrically coupling the terminal 523 and the excitation electrode 521, and a wire 526 electrically coupling the terminal 524 and the excitation electrode 522.

Note that the configuration of the vibrator element 5 is not limited to the above described configuration. For example, the vibrator element 5 may have a mesa structure in which a vibrating region sandwiched by the excitation electrodes 521, 522 projects from a surrounding part, or inverted-mesa structure in which a vibrating region is recessed from a surrounding part. Further, bevel processing of grinding a surrounding part of the vibrator substrate 51 and chamfering corner portions or convex processing of processing the upper surface and the lower surface into convex curved surfaces.

Furthermore, the vibrator element 5 is not limited to the element that vibrates in the thickness-shear vibration mode, but e.g. a tuning-fork type vibrator element having two vibration arms that tuning-fork vibrate in in-plane directions. That is, the vibrator substrate 51 is not limited to the AT cut quartz crystal substrate, but may be another quartz crystal substrate than the AT cut quartz crystal substrate, e.g. an X cut quartz crystal substrate, Y cut quartz crystal substrate, Z cut quartz crystal substrate, BT cut quartz crystal substrate, SC cut quartz crystal substrate, or ST cut quartz crystal substrate. In the embodiment, the vibrator substrate 51 is formed of quartz crystal, but may be formed of piezoelectric single crystal of e.g. lithium niobate, lithium tantalate, lithium tetraborate, langasite, potassium niobate, or gallium phosphate, or another piezoelectric single crystal. Or, the vibrator element 5 is not limited to the piezoelectrically driven vibrator element, but may be an electrostatically driven vibrator element using an electrostatic force.

As shown in FIGS. 2 and 3, the vibrator element 5 is fixed to the upper surface of the base 4 by conducting bonding members B1, B2. Further, the conducting bonding member B1 electrically couples the internal terminal 441 of the base 4 and the terminal 523 of the vibrator element 5, and the conducting bonding member B2 electrically couples the internal terminal 451 of the base 4 and the terminal 524 of the vibrator element 5.

The conducting bonding members B1, B2 are not particularly limited as long as the members have both conductivity and bondability, but e.g. various metal bumps including gold bump, silver bump, copper bump, and solder bump, conducting adhesives in which conducting fillers such as silver fillers are dispersed in various adhesives such as polyimide, epoxy, silicone, acrylic adhesives. When the former metal bumps are used as the conducting bonding members B1, B2, generation of gasses from the conducting bonding members B1, B2 may be suppressed, and environment changes of the housing space S, particularly, pressure rise may be effectively suppressed. On the other hand, when the latter conducting adhesives are used as the conducting bonding members B1, B2, the conducting bonding members B1, B2 are softer than the metal bumps and stress is harder to be generated in the vibrator element 5.

As above, the overall configuration of the vibrator device 1 is explained. Next, the insulating layer 42 as one of the features of the vibrator device 1 will be explained in detail. As described above, the insulating layer 42 has the upper surface insulating layer 421 placed on the upper surface 412 of the base substrate 41 and the lower surface insulating layer 422 placed on the lower surface 411. Further, the internal terminals 441, 451 are placed on the upper surface insulating layer 421, and the external terminals 442, 452 and the dummy terminals 461, 462 are placed on the lower surface insulating layer 422.

(A) Features of Upper Surface Insulating Layer 421

As shown in FIG. 7, the upper surface insulating layer 421 is divided into a plurality of pieces according to the number of the internal terminals placed on the upper surface insulating layer 421. Specifically, the upper surface insulating layer 421 is divided into a first internal terminal region 4211 in which the internal terminal 441 is placed and a second internal terminal region 4212 in which the internal terminal 451 is placed, and the first, second internal terminal regions 4211, 4212 are separated from each other.

(B) Features of Lower Surface Insulating Layer 422

As shown in FIG. 8, the lower surface insulating layer 422 is divided into a plurality of pieces according to the number of the terminals placed on the lower surface insulating layer 422. Specifically, the lower surface insulating layer 422 is divided into a first external terminal region 4221 in which the external terminal 442 is placed, a second external terminal region 4222 in which the external terminal 452 is placed, a third external terminal region 4223 in which the dummy terminal 461 is placed, and a fourth external terminal region 4224 in which the dummy terminal 462 is placed. Further, these first, second, third, fourth external terminal regions 4221, 4222, 4223, 4224 are separated from one another.

Effects by Features of (A), (B)

As described above, the upper surface insulating layer 421 and the lower surface insulating layer 422 are respectively divided into the pluralities of regions, and thereby, compared to the case without division, film stress of the upper surface insulating layer 421 and the lower surface insulating layer 422 may be suppressed to be lower, warpage of the base substrate 41 may be reduced, and internal stress of the base substrate 41 may be reduced.

Regarding the upper surface insulating layer 421, representatively, as shown in FIG. 9, if the upper surface insulating layer 421 is not divided, film stress (compression stress) is generated in the entire film, and thereby, film stress is larger. The film stress is applied to the entire region of the base substrate 41, and an amount of warpage G of the base substrate 41 is larger and internal stress remaining in the base substrate 41 is larger according to the amount. On the other hand, as shown in FIG. 10, when the upper surface insulating layer 421 is divided, film stress is generated in each of the divided regions, and thereby, film stress is suppressed to be lower, the respective film stress is divisionally applied to the plurality of regions Q1 of the base substrate 41. Further, film stress may be relaxed in a region Q2 located between the adjacent regions Q1, to which film stress is harder to be applied, and thus, the amount of warpage G of the base substrate 41 is smaller and internal stress remaining in the base substrate 41 is smaller according to the amount. On the above described reasons, the upper surface insulating layer 421 and the lower surface insulating layer 422 are respectively divided into the pluralities of regions, and thereby, warpage of the base substrate 41 may be reduced and internal stress of the base substrate 41 may be reduced.

Particularly, the upper surface insulating layer 421 is divided into the first internal terminal region 4211 and the second internal terminal region 4212 to divide the internal terminals 441, 451. Accordingly, the internal terminals 441, 451 may be insulated more reliably. Similarly, the lower surface insulating layer 422 is divided into the first external terminal region 4221, the second external terminal region 4222, the third external terminal region 4223, and the fourth external terminal region 4224 to divide the external terminals 442, 452 and the dummy terminals 461, 462. Accordingly, the external terminals 442, 452 and the dummy terminals 461, 462 may be respectively insulated more reliably. The effects will be explained more specifically in the following manufacturing method.

As shown in FIG. 7, the internal terminal 441 is located inside of the outer edge of the first internal terminal region 4211 in the plan view. That is, the first internal terminal region 4211 includes the internal terminal 441 in the plan view. Further, the first internal terminal region 4211 has a similarity shape along the outer edge of the internal terminal 441 in the plan view. Similarly, the internal terminal 451 is located inside of the outer edge of the second internal terminal region 4212. That is, the second internal terminal region 4212 includes the internal terminal 451 in the plan view. Further, the second internal terminal region 4212 has a similarity shape along the outer edge of the internal terminal 451 in the plan view.

According to the configuration, the areas of the first, second internal terminal regions 4211, 4212 may be respectively reduced, and the film stress generated from the first, second internal terminal regions 4211, 4212 may be suppressed to be lower by the reduced amounts. Accordingly, the warpage of the base substrate 41 may be reduced more effectively and the internal stress of the base substrate 41 may be reduced more effectively. Note that the shape of the first internal terminal region 4211 is not particularly limited, but may be e.g. a shape in which all or part of the outer edge thereof may overlap with the outer edge of the internal terminal 441 or not a shape conforming to the outer shape of the internal terminal 441 in the plan view. Similarly, the shape of the second internal terminal region 4212 may be e.g. a shape in which all or part of the outer edge thereof may overlap with the outer edge of the internal terminal 451 or not a shape conforming to the outer shape of the internal terminal 451 in the plan view.

Further, as shown in FIG. 8, in the lower surface insulating layer 422, an insulating layer non-formation region N located between the first external terminal region 4221, the second external terminal region 4222, the third external terminal region 4223, and the fourth external terminal region 4224 and dividing these regions from one another is in a crossed shape having a first portion N1 connecting the first side 41a and the second side 41b in a center portion thereof and a second portion N2 connecting the third side 41c and the fourth side 41d in a center portion thereof. No insulating layer is formed in the insulating layer non-formation region N. As described above, the insulating layer non-formation region N has the crossed shape, and thereby, warpage of both end portions along the X-axis of the base substrate 41 and warpage of both end portions along the Y-axis of the base substrate 41 may be respectively effectively suppressed.

The external terminal 442 is located inside of the outer edge of the first external terminal region 4221 in the plan view. Further, the first external terminal region 4221 has a shape conforming to the outer edge of the external terminal 442 in the plan view. Similarly, the external terminal 452 is located inside of the outer edge of the second external terminal region 4222. Further, the second external terminal region 4222 has a shape conforming to the outer edge of the external terminal 452 in the plan view. Similarly, the dummy terminal 461 is located inside of the outer edge of the third external terminal region 4223. Further, the third external terminal region 4223 has a shape conforming to the outer edge of the dummy terminal 461 in the plan view. Similarly, the dummy terminal 462 is located inside of the outer edge of the fourth external terminal region 4224. Further, the fourth external terminal region 4224 has a shape conforming to the outer edge of the dummy terminal 462 in the plan view.

According to the configuration, the areas of the first to fourth external terminal regions 4221 to 4224 may be respectively reduced, and the film stress generated from the first to fourth external terminal regions 4221 to 4224 may be respectively suppressed to be lower by the reduced amounts. Accordingly, the warpage of the base substrate 41 may be reduced more effectively and the internal stress of the base substrate 41 may be reduced more effectively. Note that the shape of the first external terminal region 4221 is not particularly limited, but may not be a shape conforming to the outer shape of the external terminal 442. Similarly, the shapes of the second to fourth external terminal regions 4221 to 4224 may not be shapes conforming to the outer shapes of the external terminal 452 and the dummy terminals 461, 462.

The above described upper surface insulating layer 421 and the lower surface insulating layer 422 may be formed by plasma CVD using TEOS (tetraethoxysilane), and a film having tensile stress or a film having compressive stress maybe formed depending on the deposition condition as described above. It is preferable that both the upper surface insulating layer 421 and the lower surface insulating layer 422 are films having tensile stress or compressive stress. The compression directions of the upper surface insulating layer 421 and the lower surface insulating layer 422 are the same, and thereby, at least part of the film stress may be cancelled out and the warpage of the base substrate 41 may be suppressed more effectively.

Further, for example, it is preferable that the areas and the thicknesses of the upper surface insulating layer 421 and the lower surface insulating layer 422 are adjusted so that the film stress of the upper surface insulating layer 421 and the film stress of the lower surface insulating layer 422 may be effectively cancelled out. For example, when the deposition conditions are equal and the area of the upper surface insulating layer 421 is smaller than the area of the lower surface insulating layer 422, the thickness of the upper surface insulating layer 421 may be made larger than the thickness of the lower surface insulating layer 422, and, when the area of the upper surface insulating layer 421 and the area of the lower surface insulating layer 422 are substantially equal, the thickness of the upper surface insulating layer 421 and the thickness of the lower surface insulating layer 422 may be made substantially equal.

As above, the vibrator device 1 was explained. As described above, the vibrator device 1 has the base 4, the vibrator element 5 attached to the base 4, and the lid 3 as a lid bonded to the base 4 to house the vibrator element 5 between the base 4 and itself. Further, the base 4 has the base substrate 41 as a semiconductor substrate including the upper surface 412 as a first surface to which the lid 3 is bonded and the lower surface 411 as a second surface having the front-back relationship with the upper surface 412, the upper surface insulating layer 421 as a first insulating layer placed on the upper surface 412, the internal terminal 441 as a first internal terminal and the internal terminal 451 as a second internal terminal placed on the upper surface insulating layer 421 and electrically coupled to the vibrator element 5, the lower surface insulating layer 422 as a second insulating layer placed on the lower surface 411, and the external terminal 442 as a first external terminal electrically coupled to the internal terminal 441 and the external terminal 452 as a second external terminal electrically coupled to the internal terminal 451. Further, (A) the upper surface insulating layer 421 has the first internal terminal region 4211 in which the internal terminal 441 is placed, and the second internal terminal region 4212 separated from the first internal terminal region 4211, in which the internal terminal 451 is placed. Furthermore, (B) The lower surface insulating layer 422 has the first external terminal region 4221 in which the external terminal 442 is placed and the second external terminal region 4222 separated from the first external terminal region 4221, in which the external terminal 452 is placed.

According to the configuration, compared to the case where neither the upper surface insulating layer 421 nor the lower surface insulating layer 422 is divided, the film stress of the upper surface insulating layer 421 and the lower surface insulating layer 422 may be suppressed to be lower and the warpage of the base substrate 41 may be reduced, and the internal stress of the base substrate 41 may be reduced. Note that, in the embodiment, the upper surface insulating layer 421 is divided into the first internal terminal region 4211 and the second internal terminal region 4212 and the lower surface insulating layer 422 is divided into the first external terminal region 4221 and the second external terminal region 4222, however, one of the upper surface insulating layer 421 and the lower surface insulating layer 422 is not necessarily divided into the plurality of regions.

Further, as described above, the base 4 has the dummy terminal 461 as a third external terminal and the dummy terminal 462 as a fourth external terminal placed on the lower surface insulating layer 422. The lower surface insulating layer 422 has the third external terminal region 4223 separated from the first external terminal region 4221 and the second external terminal region 4222, in which the dummy terminal 461 is placed, and the fourth external terminal region 4224 separated from the first external terminal region 4221, the second external terminal region 4222, and the third external terminal region 4223, in which the dummy terminal 462 is placed. As described above, the lower surface insulating layer 422 is divided with respect to each of the four electrodes, and thereby, the film stress of the lower surface insulating layer 422 may be suppressed to be even lower, the warpage of the base substrate 41 may be reduced, and the internal stress of the base substrate 41 may be reduced.

As described above, the base substrate 41 has the rectangular shape in the plan view, and the first external terminal region 4221, the second external terminal region 4222, the third external terminal region 4223, and the fourth external terminal region 4224 are separated by the insulating layer non-formation region N having the first portion N1 connecting the first side 41a included in the outer edge of the base substrate 41 and the second side 41b facing the first side 41a and the second portion N2 connecting the third side 41c and the fourth side 41d facing the third side 41c. According to the configuration, the insulating layer non-formation region N may be formed in the crossed shape, the warpage of both end portions along the X-axis of the base substrate 41 as seen along the Y-axis and the warpage of both end portions along the Y-axis of the base substrate 41 as seen along the X-axis may be respectively effectively suppressed.

As described above, the internal terminal 441 is located inside of the outer edge of the first internal terminal region 4211 and the first internal terminal region 4211 has the shape conforming to the outer edge of the internal terminal 441 in the plan view. Further, the internal terminal 451 is located inside of the outer edge of the second internal terminal region 4212 and the second internal terminal region 4212 has the shape conforming to the outer edge of the internal terminal 451 in the plan view. According to the configuration, the areas of the first, second internal terminal regions 4211, 4212 may be respectively reduced, and the film stress generated from the first, second internal terminal regions 4211, 4212 may be suppressed to be lower by the reduced areas. Accordingly, the warpage of the base substrate 41 may be reduced more effectively and the internal stress of the base substrate 41 may be reduced more effectively.

As described above, the external terminal 442 is located inside of the outer edge of the first external terminal region 4221 and the first external terminal region 4221 has the shape conforming to the outer edge of the external terminal 442 in the plan view. Further, the external terminal 452 is located inside of the outer edge of the second external terminal region 4222 and the second external terminal region 4222 has the shape conforming to the outer edge of the external terminal 452 in the plan view. According to the configuration, the areas of the first, second external terminal region 4221, 4222 may be respectively reduced, and the film stress generated from the first, second external terminal regions 4221, 4222 may be suppressed to be lower by the reduced areas. Accordingly, the warpage of the base substrate 41 may be reduced more effectively and the internal stress of the base substrate 41 may be reduced more effectively.

Note that the vibrator device 1 is not limited to the above described configuration, but, for example, as shown in FIG. 11, the corner portions of the first to fourth external terminal regions 4221 to 4224 may be respectively rounded. Thereby, stress concentration may be reduced. Further, as shown in FIG. 12, the first to fourth external terminal regions 4221 to 4224 may be respectively located inside of the outer edge of the lower surface 411. Thereby, peeling of the first to fourth external terminal regions 4221 to 4224 may be suppressed. Furthermore, as shown in FIG. 13, the upper surface insulating layer 421 may have an adjustment region 4213 for stress adjustment with no terminal or the like placed thereon. The configurations in FIGS. 11 and 12 may be applied to the upper surface insulating layer 421, and the configuration in FIG. 13 may be applied to the lower surface insulating layer 422.

Next, a method of manufacturing the vibrator device is explained. As shown in FIG. 14, the method of manufacturing the vibrator device 1 includes a vibrator element attachment step of preparing a base wafer 400 including a plurality of integrally formed bases 4 and attaching the vibrator elements 5 to the respective bases 4, a bonding step of bonding a lid wafer 300 including a plurality of integrally formed lids 3 to the base wafer 400 and forming a device wafer 100 including a plurality of integrally formed vibrator devices 1, and a singulation step of singulating the plurality of vibrator devices 1 from the device wafer 100. As below, the manufacturing method will be explained with reference to FIGS. 15 to 21. Note that FIGS. 15 to 21 show sections corresponding to FIG. 2.

Vibrator Element Attachment Step

Figure 15:
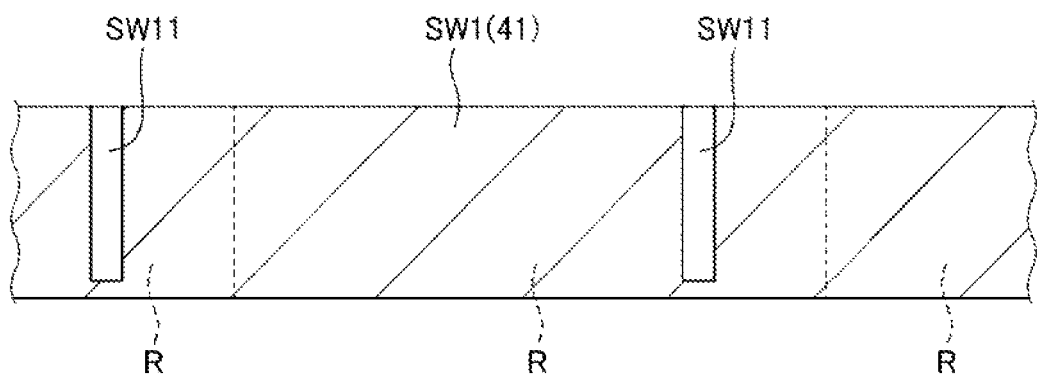
FIG. 15 is a sectional view showing the manufacturing process of the vibrator device.
Figure 16:
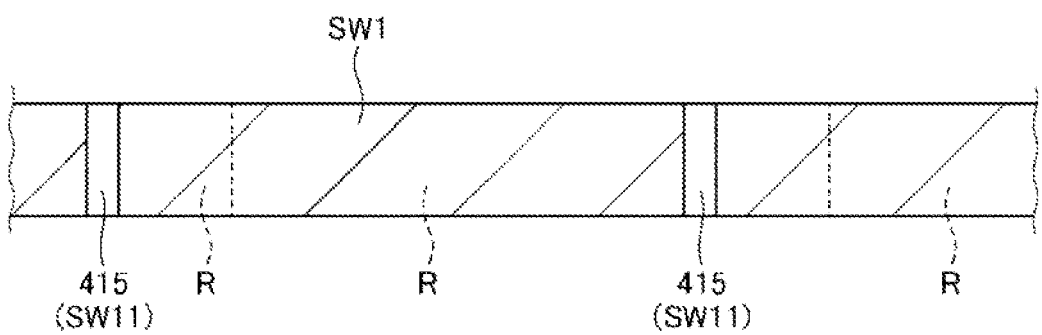
FIG. 16 is a sectional view showing the manufacturing process of the vibrator device.

First, as shown in FIG. 15, a silicon wafer SW1 as a base material of the base substrate 41 is prepared. The silicon wafer SW1 includes a plurality of singulation regions R to be single base substrates 41 at the subsequent singulation step arranged in a matrix form. Then, in each singulation region R, two concave portions SW11 having bottoms are formed from the upper surface side. The concave portions SW11 may be formed by e.g. dry etching represented by the Bosch process. Then, as shown in FIG. 16, the silicon wafer SW1 is ground and polished from the lower surface side and the silicon wafer SW1 is made thinner so that the concave portions SW11 may penetrate. Thereby, the through holes 415, 416 are formed in each singulation region R.

Figure 17:
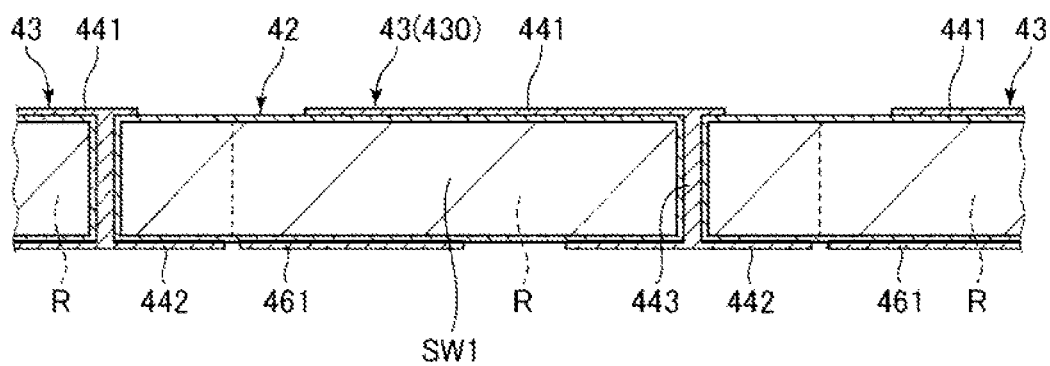
FIG. 17 is a sectional view showing the manufacturing process of the vibrator device.

Then, as shown in FIG. 17, the insulating layer 42 of a silicon oxide film is formed on the surface of the silicon wafer SW1, and further, electrodes 43 are formed on the insulating layer 42 with respect to each singulation region R. The insulating layer 42 may be formed by the plasma CVD method using thermal oxidation or TEOS. Further, the electrodes 43 may be formed by deposition of a metal film 430 on the insulating layer 42 by evaporation or sputtering and patterning of the metal film 430 by etching.

Figure 18:
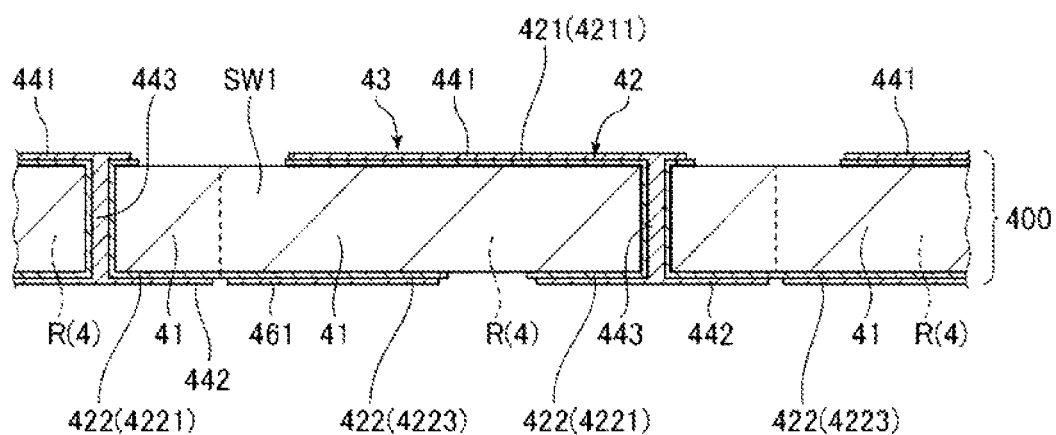
FIG. 18 is a sectional view showing the manufacturing process of the vibrator device.

Then, as shown in FIG. 18, with respect to each singulation region R, the upper surface insulating layer 421 is removed from the outer peripheral portion thereof and the upper surface insulating layer 421 is divided into the first internal terminal region 4211 and the second internal terminal region 4212. Further, with respect to each singulation region R, the lower surface insulating layer 422 is divided into the first external terminal region 4221, the second external terminal region 4222, the third external terminal region 4223, and the fourth external terminal region 4224. The patterning of the insulating layer 42 may be performed by e.g. wet etching. Through the above described steps, the base wafer 400 in which the plurality of bases 4 are integrally formed is obtained.

Here, when the electrodes 43 are formed by patterning of the metal film 430, if the removal of the metal film 430 is incomplete, the first wire 44 and the second wire 45 may be short-circuited. However, even in the case, in the embodiment, the upper surface insulating layer 421 is divided between the two terminals and the lower surface insulating layer 422 is divided among the four terminals, and thereby, the above described short circuit may be suppressed more reliably.

Figure 19:
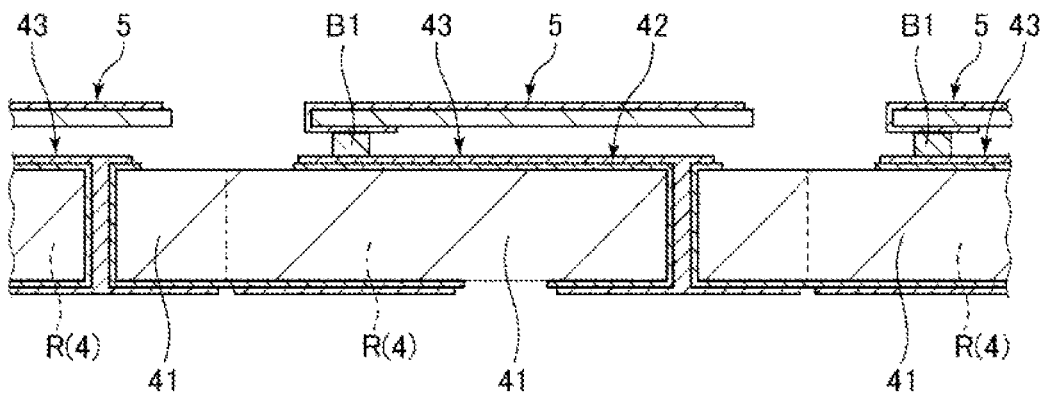
FIG. 19 is a sectional view showing the manufacturing process of the vibrator device.

Then, as shown in FIG. 19, the vibrator element 5 is attached to the upper surface side of each base 4, and the vibrator element 5 and the internal terminals 441, 451 are electrically coupled via the conducting bonding members B1, B2.

Bonding Step

Figure 20:
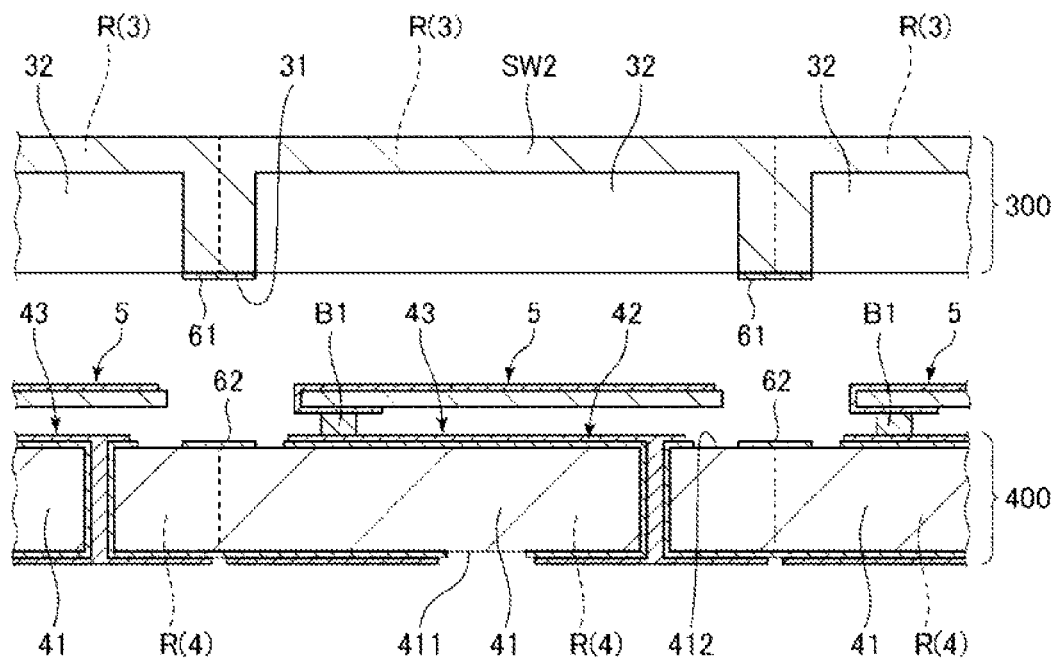
FIG. 20 is a sectional view showing the manufacturing process of the vibrator device.

First, as shown in FIG. 20, a silicon wafer SW2 as a base material of the lid 3 is prepared. The silicon wafer SW2 is a single-crystal silicon wafer. Further, the silicon wafer SW2 includes a plurality of singulation regions R to be single lids 3 by the subsequent singulation arranged in a matrix form. Then, in each singulation region R, the concave portion 32 having the bottom is formed from the lower surface side. Through the above described steps, the lid wafer 300 in which the plurality of lids 3 are integrally formed is obtained.

Figure 21:
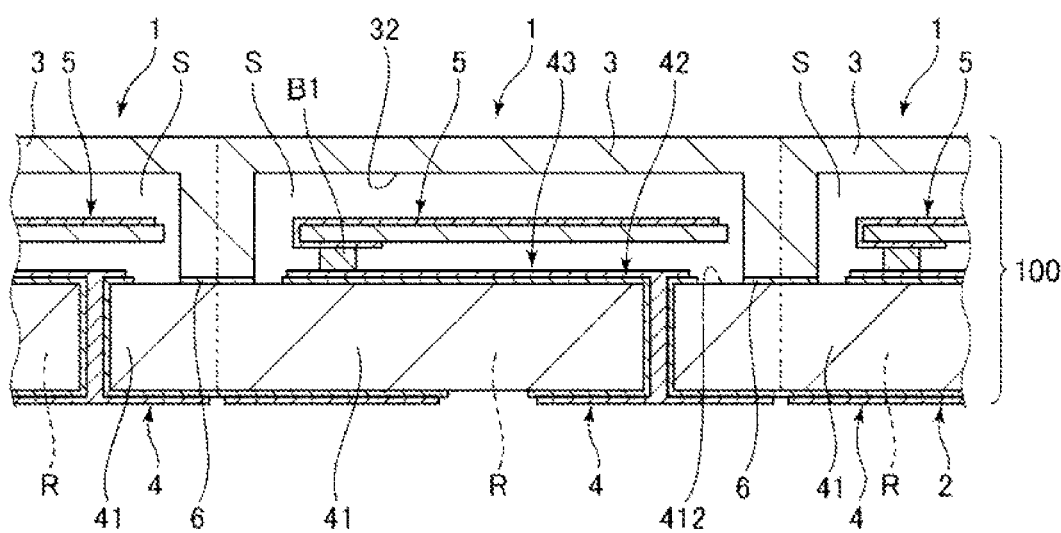
FIG. 21 is a sectional view showing the manufacturing process of the vibrator device.

Then, the metal film 62 is formed on the upper surface 412 of each base substrate 41 and the metal film 61 is formed on the lower surface 31 of each lid 3. Then, for example, Ar gas is sprayed on the metal films 61, 62 and activated, as shown in FIG. 21, the metal films 61, 62 are diffusion-bonded, and thereby, the base wafer 400 and the lid wafer 300 are directly bonded. Through the above described steps, the device wafer 100 in which the plurality of vibrator devices 1 are integrally formed is obtained.

Singulation Step

Then, the respective vibrator devices 1 are singulated from the device wafer 100 using a dicing blade. Note that the singulation method is not particularly limited. In the above described manner, the plurality of vibrator devices 1 are collectively manufactured.

As above, the method of manufacturing the vibrator device 1 was explained. The method of manufacturing the vibrator device 1 includes the step of preparing the base substrate 41 having the upper surface 412 as the first surface and the lower surface 411 as the second surface in the front-back relationship with each other, forming the upper surface insulating layer 421 as the first insulating layer on the upper surface 412, and forming the lower surface insulating layer 422 as the second insulating layer on the lower surface 411, the step of forming the internal terminal 441 as the first internal terminal and the internal terminal 451 as the second internal terminal on the upper surface insulating layer 421, and forming the external terminal 442 as the first external terminal and the external terminal 452 as the second external terminal on the lower surface insulating layer 422, the step of performing at least one of or preferably both separating the upper surface insulating layer 421 into the first internal terminal region 4211 in which the internal terminal 441 is placed and the second internal terminal region 4212 in which the internal terminal 451 is placed to obtain the above described condition (A) and separating the lower surface insulating layer 422 into the first external terminal region 4221 in which the external terminal 442 is placed and the second external terminal region 4222 in which the external terminal 452 is placed to obtain the above described condition (B), the step of attaching the vibrator element 5 to the upper surface 412 side of the base substrate 41 and electrically coupling the vibrator element 5 and the internal terminal 441 and the internal terminal 451, and the step of bonding the lid 3 as the lid to the upper surface 412 of the base substrate 41 and housing the vibrator element 5 between the base substrate 41 and the lid 3.

According to the manufacturing method, the plurality of vibrator devices 1 with suppressed warpage of base substrates 41 may be manufactured at the same time.

Second Embodiment

Figure 22:
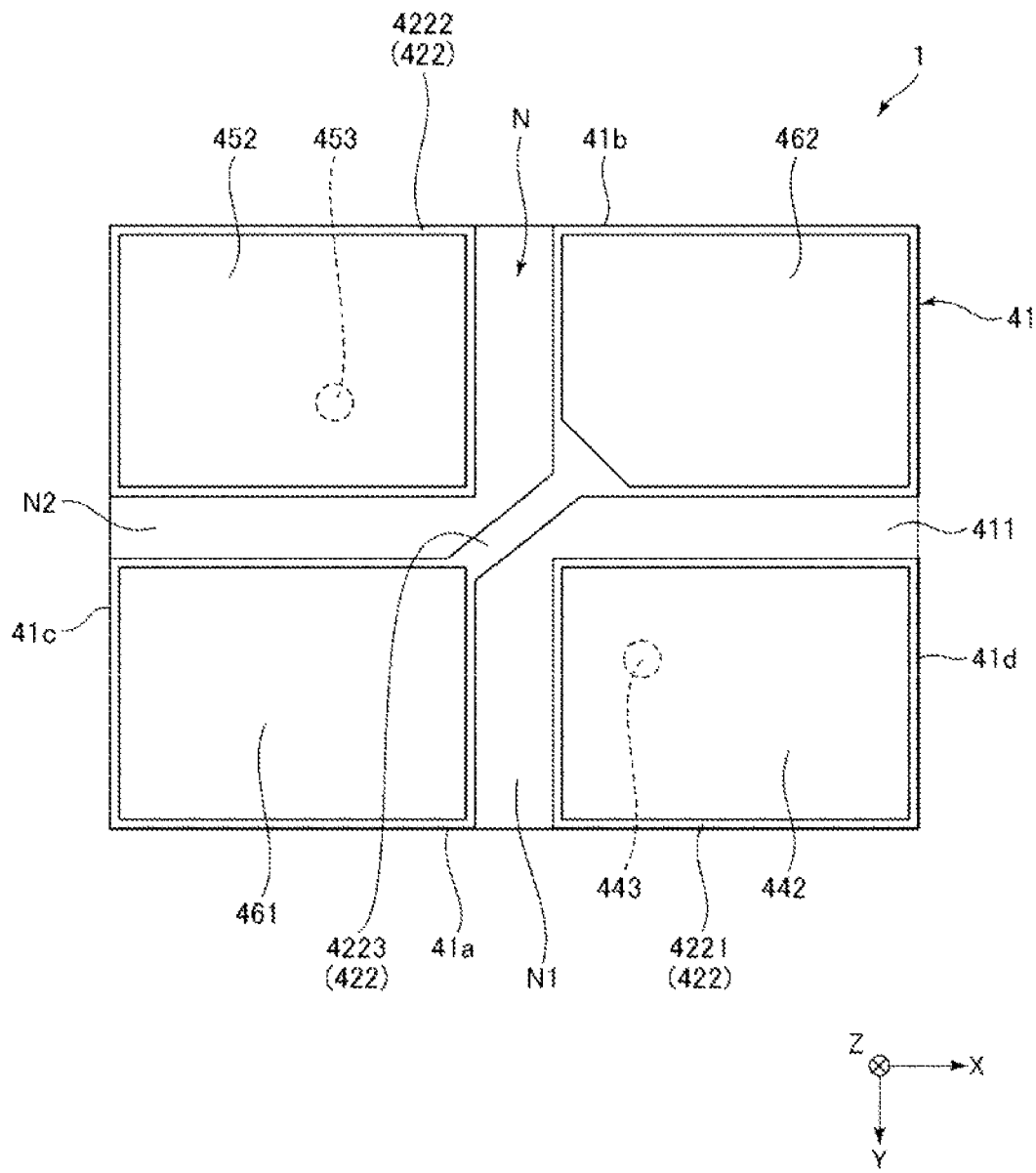
FIG. 22 is a plan view showing a lower surface insulating layer according to a second embodiment.

FIG. 22 is the plan view showing the lower surface insulating layer according to the second embodiment.

The vibrator device 1 according to the embodiment is the same as the vibrator device 1 of the above described first embodiment except that the configuration of the lower surface insulating layer 422 is different. In the following description, the vibrator device 1 of the second embodiment will be explained with a focus on the differences from the above described first embodiment and the explanation of the same items will be omitted. Further, in FIG. 22, the same configurations as those of the above described embodiment have the same signs.

In the vibrator device 1 of the embodiment, as shown in FIG. 22, the lower surface insulating layer 422 has the first external terminal region 4221 in which the external terminal 442 is placed, the second external terminal region 4222 in which the external terminal 452 is placed, and the third external terminal region 4223 in which the dummy terminals 461, 462 are placed. That is, the dummy terminals 461, 462 are placed in the same region.

Further, the insulating layer non-formation region N separating the first external terminal region 4221, the second external terminal region 4222, and the third external terminal region 4223 has the first portion N1 formed to be located between the first external terminal region 4221 and the third external terminal region 4223 and connect the first side 41a and the fourth side 41d adjacent to each other and the second portion N2 formed to be located between the second external terminal region 4222 and the third external terminal region 4223 and connect the second side 41b and the third side 41c adjacent to each other. According to the configuration, the insulating layer non-formation region N has the portion dividing the lower surface insulating layer 422 along the X-axis and the portion dividing the layer along the Y-axis, and thereby, the warpage of both end portions along the X-axis of the base substrate 41 as seen along the Y-axis and the warpage of both end portions along the Y-axis of the base substrate 41 as seen along the X-axis may be respectively effectively suppressed.

As described above, in the vibrator device 1 of the embodiment, the base substrate 41 has the rectangular shape in the plan view, and the first external terminal region 4221 and the second external terminal region 4222 are separated by the insulating layer non-formation region N formed to connect one side contained in the outer edge of the base substrate 41 and one of two sides adjacent to the side. Specifically, the insulating layer non-formation region N has the first portion N1 formed to connect the first side 41a and the fourth side 41d adjacent to each other and the second portion N2 formed to connect the second side 41b and the third side 41c adjacent to each other, and these first, second portions N1, N2 separate the first external terminal region 4221 and the second external terminal region 4222. Thereby, the insulating layer non-formation region N has the portion dividing the upper surface insulating layer 421 along the X-axis and the portion dividing the layer along the Y-axis, and thus, the warpage of both end portions along the X-axis of the base substrate 41 as seen along the Y-axis and the warpage of both end portions along the Y-axis of the base substrate 41 as seen along the X-axis may be respectively effectively suppressed.

According to the second embodiment, the same effects as those of the above described first embodiment may be exerted.

Third Embodiment

Figure 23:
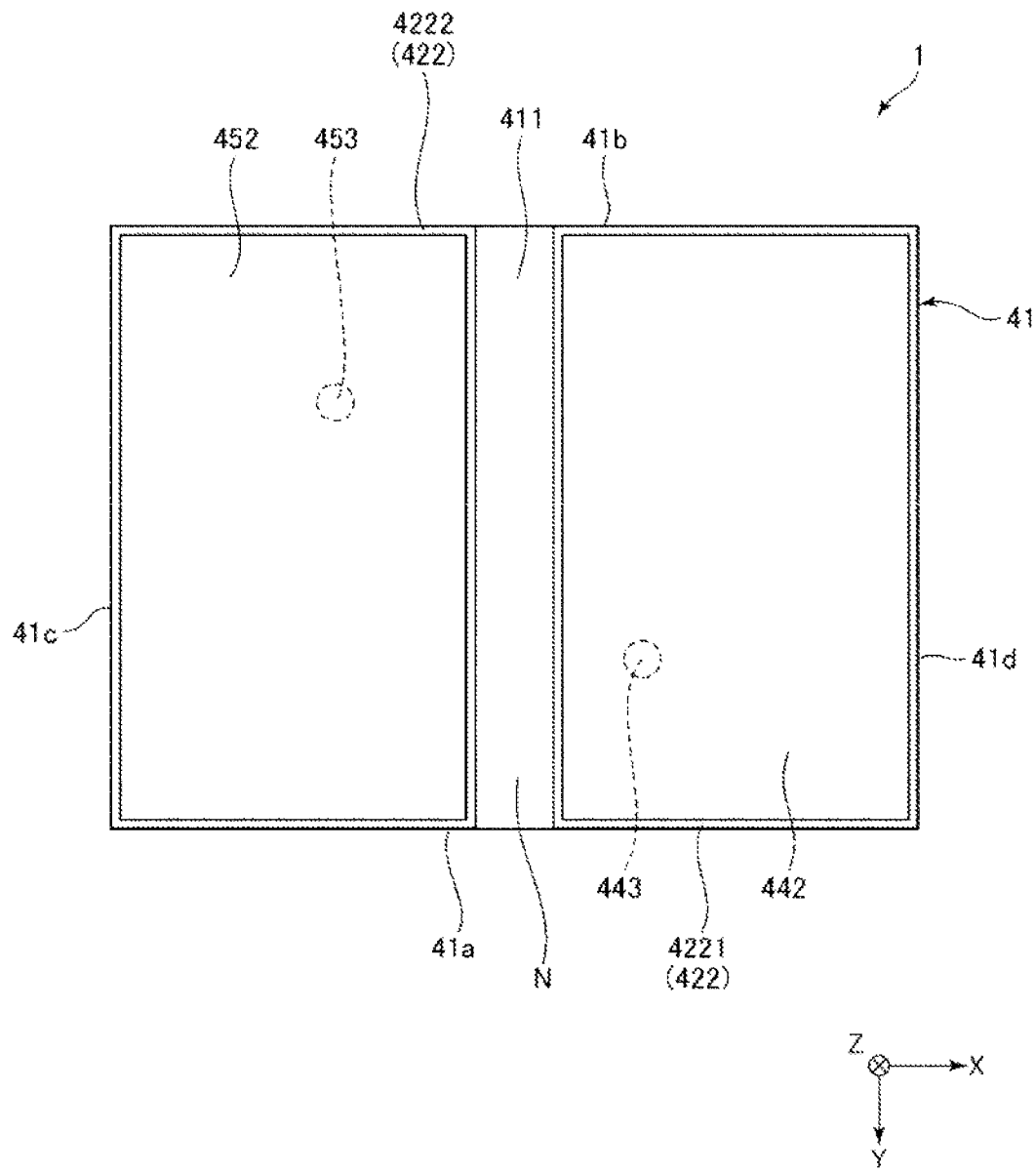
FIG. 23 is a plan view showing a lower surface insulating layer according to a third embodiment.

FIG. 23 is the plan view showing the lower surface insulating layer according to the third embodiment.

The vibrator device 1 according to the embodiment is the same as the vibrator device 1 of the above described first embodiment except that the configurations of the electrode 43 and the lower surface insulating layer 422 are different. In the following description, the vibrator device 1 of the third embodiment will be explained with a focus on the differences from the above described first embodiment and the explanation of the same items will be omitted. Further, in FIG. 23, the same configurations as those of the above described embodiments have the same signs.

In the vibrator device 1 of the embodiment, as shown in FIG. 23, the dummy terminals 461, 462 are omitted. Accordingly, the lower surface insulating layer 422 has the first external terminal region 4221 in which the external terminal 442 is placed and the second external terminal region 4222 in which the external terminal 452 is placed.

Further, the insulating layer non-formation region N separating the first external terminal region 4221 and the second external terminal region 4222 is located between the first external terminal region 4221 and the second external terminal region 4222, and formed to connect the first side 41a and the second side 41b facing each other. According to the configuration, the first external terminal region 4221 and the second external terminal region 4222 may be easily separated.

As described above, in the vibrator device 1 of the embodiment, the base substrate 41 has the rectangular shape in the plan view, and the first external terminal region 4221 and the second external terminal region 4222 are separated by the insulating layer non-formation region N formed to connect the pair of the facing first side 41a and second side 41b contained in the outer edge of the base substrate 41. According to the configuration, the first external terminal region 4221 and the second external terminal region 4222 may be easily separated.

According to the third embodiment, the same effects as those of the above described first embodiment may be exerted.

Fourth Embodiment

Figure 24:
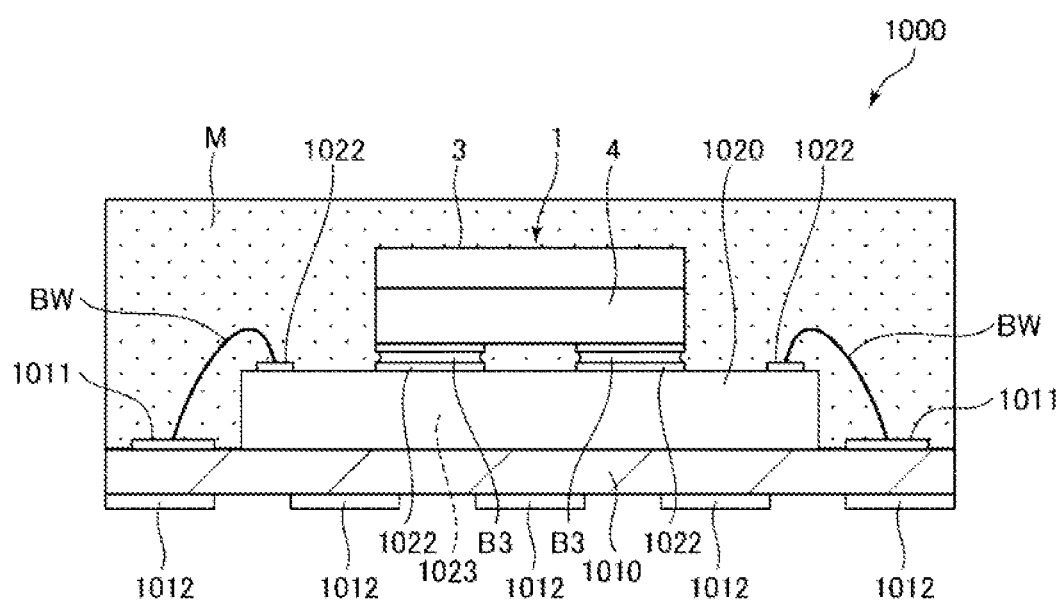
FIG. 24 is a sectional view showing a vibrator module according to a fourth embodiment.

FIG. 24 is the sectional view showing the vibrator module according to the fourth embodiment.

The vibrator module 1000 shown in FIG. 24 has a support substrate 1010, a circuit board 1020 mounted on the support substrate 1010, the vibrator device 1 mounted on the circuit board 1020, and a molding material M for molding the circuit board 1020 and the vibrator device 1.

The support substrate 1010 is e.g. an interposer substrate. A plurality of coupling terminals 1011 are placed on the upper surface of the support substrate 1010, and a plurality of mount terminals 1012 are placed on the lower surface. Further, internal wires (not shown) are placed within the support substrate 1010 and the respective coupling terminals 1011 are electrically coupled to the corresponding mount terminals 1012 via the internal wires. The support substrate 1010 is not particularly limited, but e.g. a silicon substrate, ceramic substrate, resin substrate, glass substrate, glass epoxy substrate, or the like may be used.

The circuit board 1020 is bonded to the upper surface of the support substrate 1010 via a die attach material. In the circuit board 1020, an oscillation circuit 1023 that oscillates the vibrator element 5 which is included in the vibrator device 1, and generates a frequency of a reference signal such as a clock signal is formed, and a plurality of terminals 1022 electrically coupled to the oscillation circuit are placed on the upper surface thereof. A part of the terminals 1022 is electrically coupled to the coupling terminals 1011 via bonding wires BW, and a part of the terminals 1022 are electrically coupled to the vibrator device 1 via e.g. conducting bonding members B3 of solder or the like.

The molding material M molds and protects the circuit board 1020 and the vibrator device 1 from water, dust, shock, etc. The molding material M is not particularly limited, but e.g. thermosetting epoxy resin may be used and molding is performed by transfer molding.

The above described vibrator module 1000 includes the vibrator device 1. Accordingly, the effects of the above described vibrator device 1 may be enjoyed and excellent reliability may be exerted.

Fifth Embodiment

Figure 25:
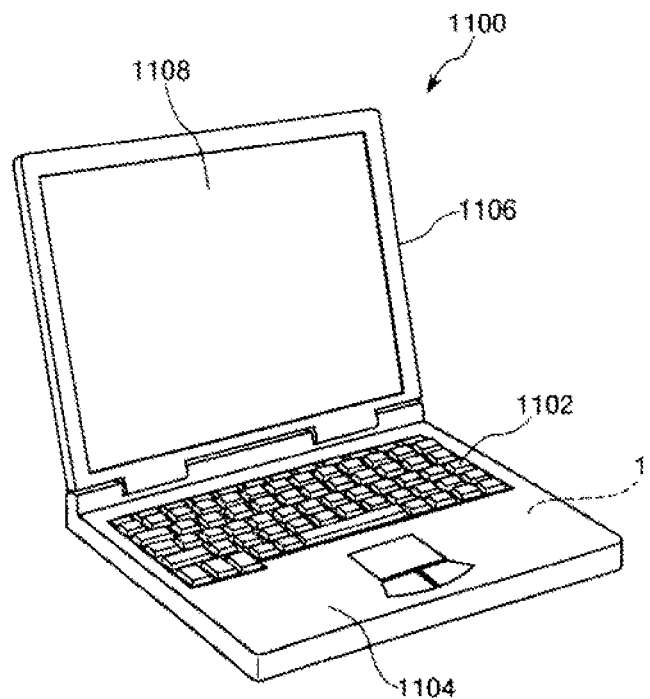
FIG. 25 is a perspective view showing an electronic apparatus according to a fifth embodiment.

FIG. 25 is the perspective view showing the electronic apparatus according to the fifth embodiment.

A laptop personal computer 1100 shown in FIG. 25 is application of an electronic apparatus including the vibrator device of the application example. In the drawing, the personal computer 1100 includes a main body 1104 having a keyboard 1102 and a display unit 1106 having a display 1108, and the display unit 1106 is pivotably supported with respect to the main body 1104 via a hinge structure. The personal computer 1100 contains the vibrator device 1 used as e.g. an oscillator.

As described above, the personal computer 1100 as the electronic apparatus includes the vibrator device 1. Accordingly, the effects of the above described vibrator device 1 may be enjoyed and high reliability may be exerted.

Sixth Embodiment

Figure 26:
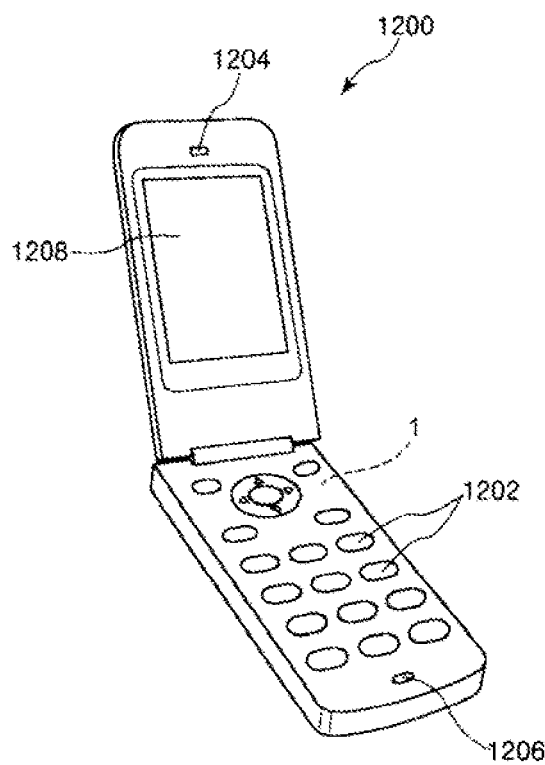
FIG. 26 is a perspective view showing an electronic apparatus according to a sixth embodiment.

FIG. 26 is the perspective view showing the electronic apparatus according to the sixth embodiment.

A cell phone 1200 shown in FIG. 26 is application of an electronic apparatus including the vibrator device of the application example. The cell phone 1200 includes a plurality of operation buttons 1202, an earpiece 1204, and a mouthpiece 1206, and a display 1208 is placed between the operation buttons 1202 and the earpiece 1204. The cell phone 1200 contains the vibrator device 1 used as e.g. an oscillator.

As described above, the cell phone 1200 as the electronic apparatus includes the vibrator device 1. Accordingly, the effects of the above described vibrator device 1 may be enjoyed and high reliability may be exerted.

Seventh Embodiment

Figure 27:
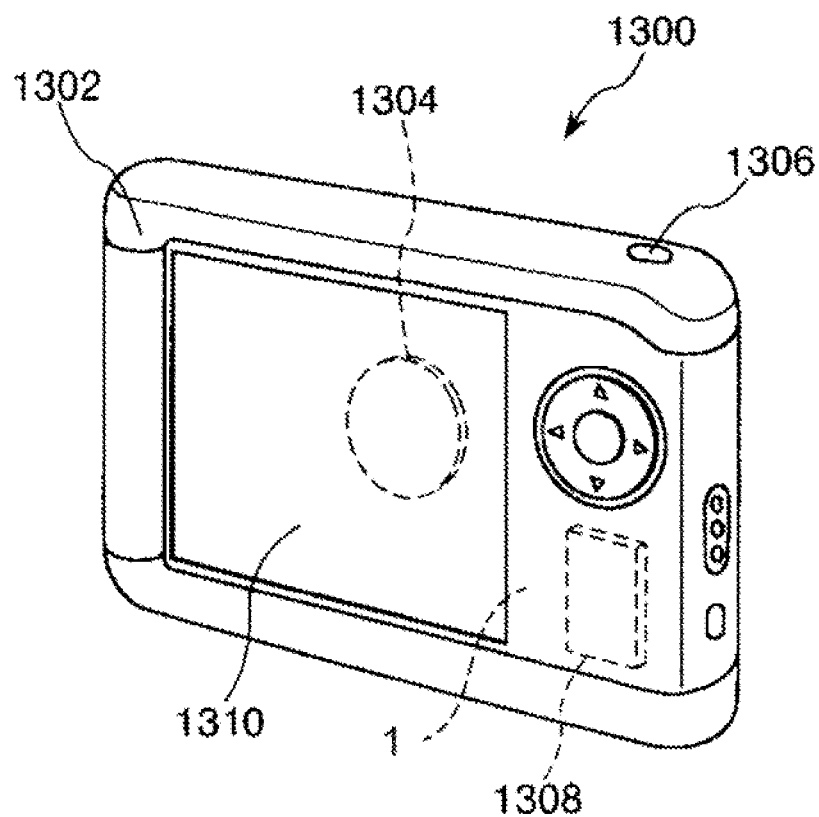
FIG. 27 is a perspective view showing an electronic apparatus according to a seventh embodiment.

FIG. 27 is the perspective view showing the electronic apparatus according to the seventh embodiment.

A digital still camera 1300 shown in FIG. 27 is application of an electronic apparatus including the vibrator device of the application example. A display 1310 is provided on the back surface of a body 1302 and adapted to display based on imaging signals by a CCD, and the display 1310 functions as a finder that displays a subject as an electronic image. Further, a light receiving unit 1304 including an optical lens, CCD, etc. is provided on the front side (the rear surface side in the drawing) of the body 1302. A photographer checks a subject image displayed on the display 1310 and presses a shutter button 1306, and then, the imaging signals of the CCD at the moment are transferred and stored in a memory 1308. The digital still camera 1300 contains the vibrator device 1 used as e.g. an oscillator.

As described above, the digital still camera 1300 as the electronic apparatus includes the vibrator device 1. Accordingly, the effects of the above described vibrator device 1 may be enjoyed and high reliability may be exerted.

Note that the electronic apparatus of the application example may be applied to the above described personal computer, cell phone, and digital still camera, and additionally, a smartphone, a tablet terminal, a timepiece (including smartwatch), an inkjet ejection apparatus (e.g. inkjet printer), a laptop personal computer, a television, a wearable terminal including HMD (head mounted display), a video camera, a video tape recorder, a car navigation system, a pager, a personal digital assistance (with or without communication function), an electronic dictionary, a calculator, an electronic game machine, a word processor, a work station, a videophone, a security television monitor, an electronic binoculars, a POS terminal, a medical apparatus (e.g., electronic thermometer, sphygmomanometer, blood glucose meter, electrocardiographic measurement apparatus, ultrasonic diagnostic apparatus, or electronic endoscope), a fish finder, various measurement instruments, apparatus for vehicle terminal base station, meters and gauges (e.g., meters for vehicles, aircrafts, and watercrafts), a flight simulator, a network server, etc.

Eighth Embodiment

Figure 28:
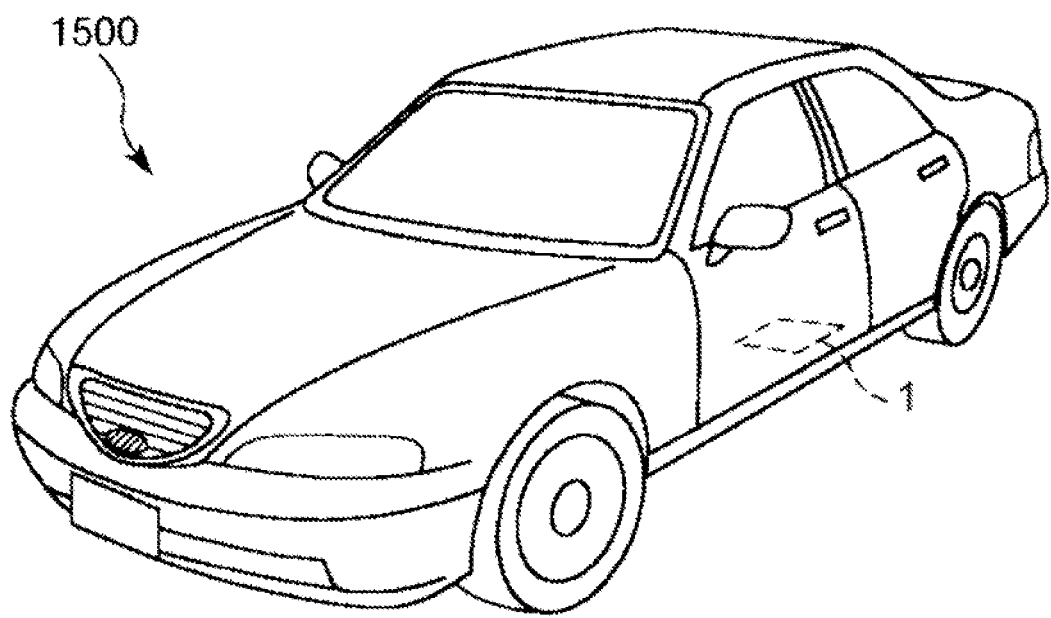
FIG. 28 is a perspective view showing a vehicle according to an eighth embodiment.

FIG. 28 is the perspective view showing the vehicle according to the eighth embodiment.

An automobile 1500 shown in FIG. 28 is application of an electronic apparatus including the vibrator device of the application example. The automobile 1500 contains the vibrator device 1 used as e.g. an oscillator. The vibrator device 1 may be widely applied to electronic control units (ECUs) for keyless entry, an immobilizer, a car navigation system, a car air-conditioner, an antilock brake system (ABS), airbag, a tire pressure monitoring system (TPMS), engine control, battery monitor for hybrid car or electric car, and a vehicle body attitude control system.

As described above, the automobile 1500 as the vehicle includes the vibrator device 1. Accordingly, the effects of the above described vibrator device 1 may be enjoyed and high reliability may be exerted.

Note that the vehicle is not limited to the automobile 1500, but may be applied to e.g. an aircraft, watercraft, AGV (automated guided vehicle), bipedal walking robot, unmanned aircraft such as a drone, or the like.

As above, the vibrator device, vibrator module, electronic apparatus, and method of manufacturing the vibrator device according to the application examples are explained based on the illustrated embodiments, however, the application examples are not limited to those. The configurations of the respective parts may be replaced by arbitrary configurations having the same functions. Further, other arbitrary configurations may be added to the application examples. Furthermore, the application examples may be combinations of arbitrary two or more configurations of the above described respective embodiments.

What is claimed is:

1. A vibrator device comprising:
a base having
a semiconductor substrate composed of silicon including a first surface and a second surface in a front-back relationship with the first surface, and includes a semiconductor circuit having an active surface on the first surface side or the second surface side of the semiconductor substrate,
a first insulating layer which is a film made of silicon oxide disposed on the first surface,
a first internal terminal and a second internal terminal placed on the first insulating layer,
a second insulating layer which is a film made of silicon oxide disposed on the second surface and divided into a plurality of regions including a first external terminal region and a second external terminal region separated from the first external terminal region,
a first external terminal placed in the first external terminal region and electrically coupled to the first internal terminal, and
a second external terminal placed in the second external terminal region and electrically coupled to the second internal terminal;
a vibrator element placed on the first surface and electrically coupled to the first internal terminal and the second internal terminal; and
a lid bonded to the first surface and housing the vibrator element between the base and itself, wherein
the base has an insulating layer non-formation region having no insulating layer on the second surface of the semiconductor substrate,
the semiconductor substrate has a rectangular shape in a plan view;
the insulating layer non-formation region has a first portion disposed from a first side contained in an outer edge of the semiconductor substrate to a second side facing the first side in the plan view, and
the first external terminal region and the second external terminal region are separated by the first portion of the insulating layer non-formation region.

2. The vibrator device according to claim 1, wherein
the plurality of regions of the second insulating layer further includes:
a third external terminal region separated from the first external terminal region and the second external terminal region; and
a fourth external terminal region separated from the first external terminal region, the second external terminal region, and the third external terminal region, and
the base has a third external terminal placed in the third external terminal region and a fourth external terminal placed in the fourth external terminal region.

3. The vibrator device according to claim 2, wherein the insulating layer non-formation region has a second portion disposed from a third side contained in an outer edge of the semiconductor substrate to a fourth side facing the third side in the plan view, and
the first external terminal region, the second external terminal region, the third external terminal region, and the fourth external terminal region are separated by the first portion and the second portion of the insulating layer non-formation region.

4. The vibrator device according to claim 1, wherein
the first insulating layer has a first internal terminal region in which the first internal terminal is placed and a second internal terminal region separated from the first internal terminal region, in which the second internal terminal is placed,
an outer edge of the first internal terminal region is located outside of an outer edge of the first internal terminal along the outer edge of the first internal terminal in a plan view, and
an outer edge of the second internal terminal region is located outside of an outer edge of the second internal terminal along the outer edge of the second internal terminal in the plan view.

5. The vibrator device according to claim 1, wherein
an outer edge of the first external terminal region is located outside of an outer edge of the first external terminal along the outer edge of the first external terminal in a plan view, and an outer edge of the second external terminal region is located outside of an outer edge of the second external terminal along the outer edge of the second external terminal in the plan view.

6. A vibrator device comprising:

a base having a semiconductor substrate composed of silicon including a first surface and a second surface in a front-back relationship with the first surface, and includes a semiconductor circuit having an active surface on the first surface side or the second surface side of the semiconductor substrate, a first insulating layer which is a film made of silicon oxide disposed on the first surface and divided into a plurality of regions including a first internal terminal region and a second internal terminal region separated from the first internal terminal region, a first internal terminal placed in the first internal terminal region, a second internal terminal placed in the second internal terminal region, a second insulating layer which is a film made of silicon oxide disposed on the second surface, a first external terminal placed on the second insulating layer and electrically coupled to the first internal terminal, and a second external terminal placed on the second insulating layer and electrically coupled to the second internal terminal;

a vibrator element placed on the first surface and electrically coupled to the first internal terminal and the second internal terminal; and a lid bonded to the first surface and housing the vibrator element between the base and itself, wherein the base has an insulating layer non-formation region having no insulating layer on the first surface of the semiconductor substrate, the semiconductor substrate has a rectangular shape in a plan view;

the insulating layer non-formation region is disposed from a first side contained in an outer edge of the semiconductor substrate to a second side facing the first side in the plan view, and the first internal terminal region and the second internal terminal region are separated by the insulating layer non-formation region.

7. The vibrator device according to claim 6, wherein an outer edge of the first internal terminal region is located outside of an outer edge of the first internal terminal along the outer edge of the first internal terminal in a plan view, and an outer edge of the second internal terminal region is located outside of an outer edge of the second internal terminal along the outer edge of the second internal terminal in the plan view.

* * * * *